(12) United States Patent
Ikeda et al.

(10) Patent No.: US 10,784,465 B2
(45) Date of Patent: Sep. 22, 2020

(54) LIGHT-EMITTING DEVICE HAVING WHITE LIGHT EMISSION

(71) Applicant: Semiconductor Energy Laboratory Co., Ltd., Atsugi-shi, Kanagawa-ken (JP)

(72) Inventors: Hisao Ikeda, Kanagawa (JP); Hiroki Ohara, Tokyo (JP); Makoto Hosoba, Kanagawa (JP); Junichiro Sakata, Kanagawa (JP); Shunichi Ito, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 16/031,035

(22) Filed: Jul. 10, 2018

(65) Prior Publication Data

US 2018/0315957 A1 Nov. 1, 2018

Related U.S. Application Data

(63) Continuation of application No. 15/473,711, filed on Mar. 30, 2017, which is a continuation of application (Continued)

(30) Foreign Application Priority Data

May 20, 2004 (JP) ................................. 2004-151036

(51) Int. Cl.
*H01L 51/52* (2006.01)
*H01L 51/50* (2006.01)
(Continued)

(52) U.S. Cl.
CPC ....... *H01L 51/5253* (2013.01); *G09G 3/3291* (2013.01); *H01L 27/322* (2013.01);
(Continued)

(58) Field of Classification Search
CPC ............. H01L 51/5253; H01L 51/5012; H01L 51/5203; H01L 51/5206; H01L 51/5234;
(Continued)

(56) References Cited

U.S. PATENT DOCUMENTS 4,599,538 A 7/1986 Hidierh et al.
5,003,221 A 3/1991 Shimizu
(Continued)

FOREIGN PATENT DOCUMENTS

BE 058484 A 12/2000
CN 001317922 A 10/2001
(Continued)

OTHER PUBLICATIONS

Hung.L et al., "Application of an ultrathin LiF/Al bilayer in organic surface-emitting diodes", Appl. Phys. Lett. (Applied Physics Letters), Jan. 22, 2001, vol. 78, No. 4, pp. 544-546.
(Continued)

*Primary Examiner* — Ida M Soward
(74) *Attorney, Agent, or Firm* — Fish & Richardson P.C.

(57) ABSTRACT

There has been a problem that difference in refractive index between an opposite substrate or a moisture barrier layer provided thereover, and air is maintained large, and light extraction efficiency is low. Further, there has been a problem that peeling or cracking due to the moisture barrier layer is easily generated, which leads to deteriorate the reliability and lifetime of a light-emitting element. A light-emitting element includes a pixel electrode, an electroluminescent layer, a transparent electrode, a passivation film, a stress relieving layer, and a low refractive index layer, all of which are stacked sequentially. The stress relieving layer serves to prevent peeling of the passivation film. The low refractive index layer serves to reduce reflectivity of light generated in the electroluminescent layer in emitting to air. Therefore, a
(Continued)

light-emitting element with high reliability and long lifetime and a display device using the light-emitting element can be provided.

18 Claims, 18 Drawing Sheets

Related U.S. Application Data

No. 15/157,499, filed on May 18, 2016, now Pat. No. 9,614,012, which is a continuation of application No. 14/819,550, filed on Aug. 6, 2015, now Pat. No. 9,349,775, which is a continuation of application No. 14/460,426, filed on Aug. 15, 2014, now Pat. No. 9,105,855, which is a continuation of application No. 14/197,442, filed on Mar. 5, 2014, now Pat. No. 8,809,891, which is a continuation of application No. 13/875,491, filed on May 2, 2013, now Pat. No. 8,669,579, which is a continuation of application No. 13/490,516, filed on Jun. 7, 2012, now Pat. No. 8,436,390, which is a continuation of application No. 12/706,012, filed on Feb. 16, 2010, now Pat. No. 8,212,280, which is a continuation of application No. 11/733,331, filed on Apr. 10, 2007, now Pat. No. 7,696,524, which is a continuation of application No. 11/131,437, filed on May 18, 2005, now Pat. No. 7,202,504.

(51) Int. Cl.
  H01L 27/32 (2006.01)
  G09G 3/32 (2016.01)
  G09G 3/3291 (2016.01)
  G02F 1/1362 (2006.01)

(52) U.S. Cl.
  CPC ...... *H01L 27/3211* (2013.01); *H01L 27/3246* (2013.01); *H01L 27/3272* (2013.01); *H01L 51/5012* (2013.01); *H01L 51/5203* (2013.01); *H01L 51/525* (2013.01); *H01L 51/5206* (2013.01); *H01L 51/5234* (2013.01); *H01L 51/5237* (2013.01); *H01L 51/5246* (2013.01); *H01L 51/5262* (2013.01); *H01L 51/5275* (2013.01); *H01L 51/5284* (2013.01); *G02F 2001/136222* (2013.01); *G09G 2300/0842* (2013.01); *G09G 2310/0251* (2013.01); *G09G 2320/043* (2013.01); *H01L 2251/301* (2013.01); *H01L 2251/5315* (2013.01); *H01L 2251/5323* (2013.01); *H01L 2251/5338* (2013.01); *H01L 2251/5361* (2013.01)

(58) Field of Classification Search
  CPC ............. H01L 51/5237; H01L 51/5246; H01L 51/525; H01L 51/5262; H01L 51/5275; H01L 51/5284; H01L 27/3211; H01L 27/322; H01L 27/3246; H01L 27/3272; G09G 3/3291; G02F 2001/136222; H01J 2329/1326
  See application file for complete search history.

(56) References Cited

U.S. PATENT DOCUMENTS

| | | |
|---|---|---|
| 5,107,175 A | 4/1992 | Hirano et al. |
| 5,124,204 A | 6/1992 | Yamashita et al. |
| 5,189,405 A | 2/1993 | Yamashita et al. |
| 5,343,052 A | 8/1994 | Oohata et al. |
| 5,518,824 A | 5/1996 | Funhoff et al. |
| 5,550,066 A | 8/1996 | Tang et al. |
| 5,652,067 A | 7/1997 | Ito et al. |
| 5,684,365 A | 11/1997 | Tang et al. |
| 5,686,360 A | 11/1997 | Harvey, III et al. |
| 5,693,956 A | 12/1997 | Shi et al. |
| 5,739,545 A | 4/1998 | Guha et al. |
| 5,757,126 A | 5/1998 | Harvey, III et al. |
| 5,757,139 A | 5/1998 | Forrest et al. |
| 5,771,562 A | 6/1998 | Harvey, III et al. |
| 5,811,177 A | 9/1998 | Shi et al. |
| 5,817,366 A | 10/1998 | Arai et al. |
| 5,821,138 A | 10/1998 | Yamazaki et al. |
| 5,909,038 A | 6/1999 | Hwang et al. |
| 5,909,081 A | 6/1999 | Eida et al. |
| 5,952,708 A | 9/1999 | Yamazaki |
| 5,952,778 A | 9/1999 | Haskal et al. |
| 5,953,094 A | 9/1999 | Matsuoka et al. |
| 5,962,962 A | 10/1999 | Fujita et al. |
| 5,990,542 A | 11/1999 | Yamazaki |
| 5,990,615 A | 11/1999 | Sakaguchi et al. |
| 5,990,629 A | 11/1999 | Yamada et al. |
| 6,028,327 A | 2/2000 | Mizoguchi et al. |
| 6,046,543 A | 4/2000 | Bulovic et al. |
| 6,049,167 A | 4/2000 | Onitsuka et al. |
| 6,118,212 A | 9/2000 | Nakaya et al. |
| 6,121,542 A | 9/2000 | Shiotsuka et al. |
| 6,121,726 A | 9/2000 | Codama et al. |
| 6,127,199 A | 10/2000 | Inoue et al. |
| 6,132,280 A | 10/2000 | Tanabe et al. |
| 6,146,225 A | 11/2000 | Sheats et al. |
| 6,150,187 A | 11/2000 | Zyung et al. |
| 6,160,346 A | 12/2000 | Vleggaar et al. |
| 6,169,293 B1 | 1/2001 | Yamazaki |
| 6,172,459 B1 | 1/2001 | Hung et al. |
| 6,195,142 B1 | 2/2001 | Gyotoku et al. |
| 6,198,217 B1 | 3/2001 | Suzuki et al. |
| 6,198,220 B1 | 3/2001 | Jones et al. |
| 6,214,631 B1 | 4/2001 | Burrows et al. |
| 6,239,470 B1 | 5/2001 | Yamazaki |
| 6,268,695 B1 | 7/2001 | Affinito |
| 6,274,887 B1 | 8/2001 | Yamazaki et al. |
| 6,323,924 B1 | 11/2001 | Matsuoka et al. |
| 6,372,608 B1 | 4/2002 | Shimoda et al. |
| 6,376,333 B1 | 4/2002 | Yamazaki et al. |
| 6,413,645 B1 | 7/2002 | Graff et al. |
| 6,429,584 B2 | 8/2002 | Kubota |
| 6,441,468 B1 | 8/2002 | Yamazaki |
| 6,445,005 B1 | 9/2002 | Yamazaki et al. |
| 6,445,059 B1 | 9/2002 | Yamazaki |
| 6,515,310 B2 | 2/2003 | Yamazaki et al. |
| 6,525,339 B2 | 2/2003 | Motomatsu |
| 6,555,284 B1 | 4/2003 | Boroson et al. |
| 6,559,594 B2 | 5/2003 | Fukunaga et al. |
| 6,582,876 B2 | 6/2003 | Wolk et al. |
| 6,599,783 B2 | 7/2003 | Takatoku |
| 6,605,826 B2 | 8/2003 | Yamazaki et al. |
| 6,617,052 B2 | 9/2003 | Morii |
| 6,624,568 B2 | 9/2003 | Silyernailj |
| 6,638,645 B2 | 10/2003 | Sawai et al. |
| 6,660,409 B1 | 12/2003 | Komatsu et al. |
| 6,664,732 B2 | 12/2003 | Yamazaki et al. |
| 6,689,492 B1 | 2/2004 | Yamazaki et al. |
| 6,710,542 B2 | 3/2004 | Chun et al. |
| 6,720,203 B2 | 4/2004 | Carcia et al. |
| 6,728,278 B2 | 4/2004 | Kahen et al. |
| 6,737,753 B2 | 5/2004 | Kumar et al. |
| 6,739,931 B2 | 5/2004 | Yamazaki et al. |
| 6,762,553 B1 | 7/2004 | Yokogawa et al. |
| 6,768,260 B2 | 7/2004 | Fukunaga et al. |
| 6,776,880 B1 | 8/2004 | Yamazaki |
| 6,777,621 B2 | 8/2004 | Ishikawa et al. |
| 6,792,333 B2 | 9/2004 | Yamazaki |
| 6,803,127 B2 | 10/2004 | Su et al. |
| 6,806,638 B2 | 10/2004 | Lih et al. |
| 6,819,044 B2 | 11/2004 | Shirakawa et al. |
| 6,828,727 B2 | 12/2004 | Yamazaki |
| 6,831,298 B2 | 12/2004 | Park et al. |
| 6,833,668 B1 * | 12/2004 | Yamada ............. H01L 51/5246 313/505 |

(56) References Cited

U.S. PATENT DOCUMENTS

| | | | |
|---|---|---|---|
| 6,835,950 B2 | 12/2004 | Brown et al. | |
| 6,849,877 B2 | 2/2005 | Yamazaki et al. | |
| 6,849,922 B2 | 2/2005 | Park | |
| 6,864,629 B2 | 3/2005 | Miyaguchi et al. | |
| 6,869,635 B2 | 3/2005 | Kobayashi | |
| 6,872,473 B2 | 3/2005 | Song et al. | |
| 6,897,608 B2 | 5/2005 | Yamazaki et al. | |
| 6,924,594 B2 | 8/2005 | Ogura et al. | |
| 6,940,223 B2 | 9/2005 | Yamazaki | |
| 6,956,324 B2 | 10/2005 | Yamazaki | |
| 6,963,168 B2 | 11/2005 | Eida et al. | |
| 6,965,195 B2 | 11/2005 | Yamazaki et al. | |
| 6,965,197 B2 | 11/2005 | Tyan et al. | |
| 6,985,275 B2 | 1/2006 | Miyazawa | |
| 6,995,511 B2 | 2/2006 | Yamazaki et al. | |
| 7,012,367 B2 | 3/2006 | Seki | |
| 7,034,456 B2 | 4/2006 | Yamazaki et al. | |
| 7,045,822 B2 | 5/2006 | Tsuchiya | |
| 7,064,484 B2 | 6/2006 | Kim et al. | |
| 7,084,565 B2 | 8/2006 | Cho et al. | |
| 7,101,242 B2 | 9/2006 | Fukunaga et al. | |
| 7,180,093 B2 * | 2/2007 | Takayama | H01L 27/1214 257/59 |
| 7,187,121 B2 | 3/2007 | Hasegawa et al. | |
| 7,202,504 B2 | 4/2007 | Ikeda et al. | |
| 7,211,828 B2 | 5/2007 | Yamazakis et al. | |
| 7,230,271 B2 | 6/2007 | Yamazaki et al. | |
| 7,247,984 B2 | 7/2007 | Tanase et al. | |
| 7,301,277 B2 | 11/2007 | Hayashi | |
| 7,332,859 B2 | 2/2008 | Hasegawa et al. | |
| 7,362,515 B2 | 4/2008 | Miyazawa | |
| 7,420,208 B2 | 9/2008 | Yamazaki et al. | |
| 7,427,832 B2 | 9/2008 | Kobayashi | |
| 7,459,849 B2 | 12/2008 | Yamazaki et al. | |
| 7,488,985 B2 | 2/2009 | Tsuchiya | |
| 7,514,868 B2 | 4/2009 | Yamazaki et al. | |
| 7,572,478 B2 | 8/2009 | Ogura et al. | |
| 7,683,535 B2 | 3/2010 | Fukunaga et al. | |
| 7,692,378 B2 | 4/2010 | Yamazaki | |
| 7,696,524 B2 | 4/2010 | Ikeda et al. | |
| 7,728,326 B2 | 6/2010 | Yamazaki et al. | |
| 7,728,516 B2 | 6/2010 | Kawaguchi et al. | |
| 7,745,993 B2 | 6/2010 | Fukunaga et al. | |
| 7,854,640 B2 | 12/2010 | Yamazaki | |
| 7,867,053 B2 | 1/2011 | Fukunaga et al. | |
| 7,932,667 B2 * | 4/2011 | Tsuchiya | H01L 51/56 313/503 |
| 7,952,101 B2 | 5/2011 | Yamazaki et al. | |
| 8,212,280 B2 | 7/2012 | Ikeda et al. | |
| 8,436,390 B2 | 5/2013 | Ikeda et al. | |
| 8,669,579 B2 | 3/2014 | Ikeda et al. | |
| 8,809,891 B2 | 8/2014 | Ikeda et al. | |
| 9,105,855 B2 | 8/2015 | Ikeda et al. | |
| 2001/0015256 A1 | 8/2001 | Yamazaki et al. | |
| 2002/0030193 A1 | 3/2002 | Yamazaki et al. | |
| 2002/0039730 A1 | 4/2002 | Morii | |
| 2002/0089628 A1 * | 7/2002 | Jang | G02F 1/133553 349/113 |
| 2002/0125817 A1 | 9/2002 | Yamazaki et al. | |
| 2002/0158577 A1 | 10/2002 | Shimoda et al. | |
| 2002/0192576 A1 * | 12/2002 | Matsuoka | H01L 27/322 430/7 |
| 2003/0034497 A1 | 2/2003 | Yamazaki et al. | |
| 2003/0089913 A1 | 5/2003 | Takayama et al. | |
| 2003/0094615 A1 | 5/2003 | Yamazaki et al. | |
| 2003/0107326 A1 | 6/2003 | Park et al. | |
| 2003/0116768 A1 | 6/2003 | Ishikawa | |
| 2003/0129790 A1 * | 7/2003 | Yamazaki | H01L 27/3244 438/149 |
| 2003/0146439 A1 | 8/2003 | Yamazaki et al. | |
| 2003/0146695 A1 | 8/2003 | Seki | |
| 2003/0184217 A1 * | 10/2003 | Yamazaki | H01L 27/3276 313/505 |
| 2003/0211667 A1 | 11/2003 | Takatoku | |
| 2003/0211668 A1 | 11/2003 | Takatoku | |
| 2003/0230972 A1 | 12/2003 | Cok | |
| 2004/0036410 A1 * | 2/2004 | Park | H01L 27/322 313/504 |
| 2004/0121602 A1 | 6/2004 | Maruyama et al. | |
| 2004/0140762 A1 | 7/2004 | Tohma et al. | |
| 2004/0179160 A1 * | 9/2004 | Rhee | G02F 1/1362 349/139 |
| 2004/0183989 A1 * | 9/2004 | Kim | G02F 1/13394 349/155 |
| 2004/0212759 A1 | 10/2004 | Hayashi | |
| 2004/0216673 A1 | 11/2004 | Sakata et al. | |
| 2004/0218133 A1 * | 11/2004 | Park | H01L 27/1218 349/153 |
| 2004/0228569 A1 | 11/2004 | Yamazaki | |
| 2004/0239838 A1 * | 12/2004 | Lai | G02F 1/1368 349/106 |
| 2005/0062409 A1 | 3/2005 | Yamazaki et al. | |
| 2005/0084214 A1 | 4/2005 | Hayashi et al. | |
| 2005/0093436 A1 | 5/2005 | Yamazaki | |
| 2005/0098113 A1 | 5/2005 | Hayashi | |
| 2005/0127820 A1 | 6/2005 | Yamazaki et al. | |
| 2005/0263775 A1 | 12/2005 | Ikeda et al. | |
| 2005/0264182 A1 | 12/2005 | Seki | |
| 2005/0269578 A1 | 12/2005 | Barnes et al. | |
| 2005/0275346 A1 | 12/2005 | Eida et al. | |
| 2006/0141645 A1 | 6/2006 | Yamazaki et al. | |
| 2007/0096641 A1 | 5/2007 | Hasegawa et al. | |
| 2007/0181912 A1 | 8/2007 | Ikeda et al. | |
| 2007/0216289 A1 | 9/2007 | Kuma et al. | |
| 2007/0228382 A1 | 10/2007 | Yamazaki et al. | |
| 2008/0042562 A1 | 2/2008 | Hayashi | |
| 2008/0258617 A1 | 10/2008 | Kobayashi | |
| 2010/0163859 A1 | 7/2010 | Yamazaki et al. | |
| 2011/0101852 A1 | 5/2011 | Fukunaga et al. | |
| 2011/0233557 A1 | 9/2011 | Yamazaki et al. | |
| 2012/0080669 A1 | 4/2012 | Yamazaki et al. | |

FOREIGN PATENT DOCUMENTS

| | | |
|---|---|---|
| CN | 001389085 A | 1/2003 |
| CN | 001399502 A | 2/2003 |
| CN | 001416006 A | 5/2003 |
| CN | 001484474 A | 3/2004 |
| CN | 001487779 A | 4/2004 |
| CN | 001498046 A | 5/2004 |
| CN | 001571595 A | 1/2005 |
| CN | 001585584 A | 2/2005 |
| CN | 001612648 A | 5/2005 |
| EP | 1058314 A | 12/2000 |
| EP | 1100129 A | 5/2001 |
| EP | 1278244 A | 1/2003 |
| EP | 1309017 A | 5/2003 |
| EP | 1317165 A | 6/2003 |
| EP | 1324404 A | 7/2003 |
| EP | 1406474 A | 4/2004 |
| EP | 1471587 A | 10/2004 |
| JP | 05-315630 A | 11/1993 |
| JP | 07-192866 A | 7/1995 |
| JP | 07-272857 A | 10/1995 |
| JP | 08-068990 A | 3/1996 |
| JP | 09-033933 A | 2/1997 |
| JP | 11-218777 A | 8/1999 |
| JP | 11-329719 A | 11/1999 |
| JP | 2000-048951 A | 2/2000 |
| JP | 2000-223264 A | 8/2000 |
| JP | 2000-357735 A | 12/2000 |
| JP | 2001-085157 A | 3/2001 |
| JP | 2001-118674 A | 4/2001 |
| JP | 2001-202827 A | 7/2001 |
| JP | 2001-249627 A | 9/2001 |
| JP | 2001-282123 A | 10/2001 |
| JP | 2001-326071 A | 11/2001 |
| JP | 2001-357973 A | 12/2001 |
| JP | 2002-093586 A | 3/2002 |
| JP | 2002-117973 A | 4/2002 |
| JP | 2002-134270 A | 5/2002 |
| JP | 2002-252082 A | 9/2002 |

(56) References Cited

FOREIGN PATENT DOCUMENTS

| JP | 2003-017244 A | 1/2003 |
|---|---|---|
| JP | 2003-100450 A | 4/2003 |
| JP | 2003-142262 A | 5/2003 |
| JP | 2003-203771 A | 7/2003 |
| JP | 2003-234185 A | 8/2003 |
| JP | 2003-248440 A | 9/2003 |
| JP | 2003-282259 A | 10/2003 |
| JP | 2003-297547 A | 10/2003 |
| JP | 2003-303679 A | 10/2003 |
| JP | 2003-303685 A | 10/2003 |
| JP | 2003-332070 A | 11/2003 |
| JP | 2003-347041 A | 12/2003 |
| JP | 2004-079291 A | 3/2004 |
| JP | 2004-079422 A | 3/2004 |
| JP | 2004-095551 A | 3/2004 |
| JP | 2004-127608 A | 4/2004 |
| JP | 2004-139991 A | 5/2004 |

OTHER PUBLICATIONS

Office Action (Application No. 200510081725.9) dated Jun. 6, 2008.
Chinese Office Action (Application No. 201110184965.7) dated Jan. 18, 2012.
Chinese Office Action (Application No. 201110184965.7) dated Apr. 28, 2012.
Chinese Office Action (Application No. 201110184889.X) dated Jul. 26, 2013.
Tsutsui.T et al., "Electroluminescence in Organic Thin Films", Photochemical Processes in Organized Molecular Systems, 1991, pp. 437-450.
Baldo.M et al., "Highly Efficient Phosphorescent Emission From Organic Electroluminescent Devices", Nature, Sep. 10, 1998, vol. 395, pp. 151-154.
Baldo.M et al., "Very High-Efficiency Green Organic Light-Emitting Devices Based on Electrophosphorescence", Appl. Phys. Lett. (Applied Physics Letters), Jul. 5, 1999, vol. 75, No. 1, pp. 4-6.
Tsutsui.T et al., "High Quantum Efficiency in Organic Light-Emitting Devices With Iridium-Complex as a Triplet Emissive Center", Jpn. J. Appl. Phys. (Japanese Journal of Applied Physics), Dec. 15, 1999, vol. 38, No. 12B, pp. L1502-L1504.
SRO Pellet Developed by Toshima MFG Co., Which Is Attracted Attention in PDP and Organic ELD, is Applicable to Material for Protective Film in PDP and Material for Absorbent Film in Organic ELD, Semiconductor FPD World, Mar. 1, 2002, vol. 21, No. 3, pp. 85-87.
Tsuruoka.Y et al., "Transparent Thin Film Desiccant for OLEDS", SID Digest '03 : SID International Symposium Digest of Technical Papers, 2003, vol. 34, pp. 860-863.
Lim.H et al., "Flexible Organic Electroluminescent Devices Based on Fluorine-Containing Colorless Polyimide Substrates", Adv. Mater. (Advanced Materials), 2002, vol. 14, No. 18, pp. 1275-1279, Wiley-VCH Verlag GmbH & Co.

* cited by examiner

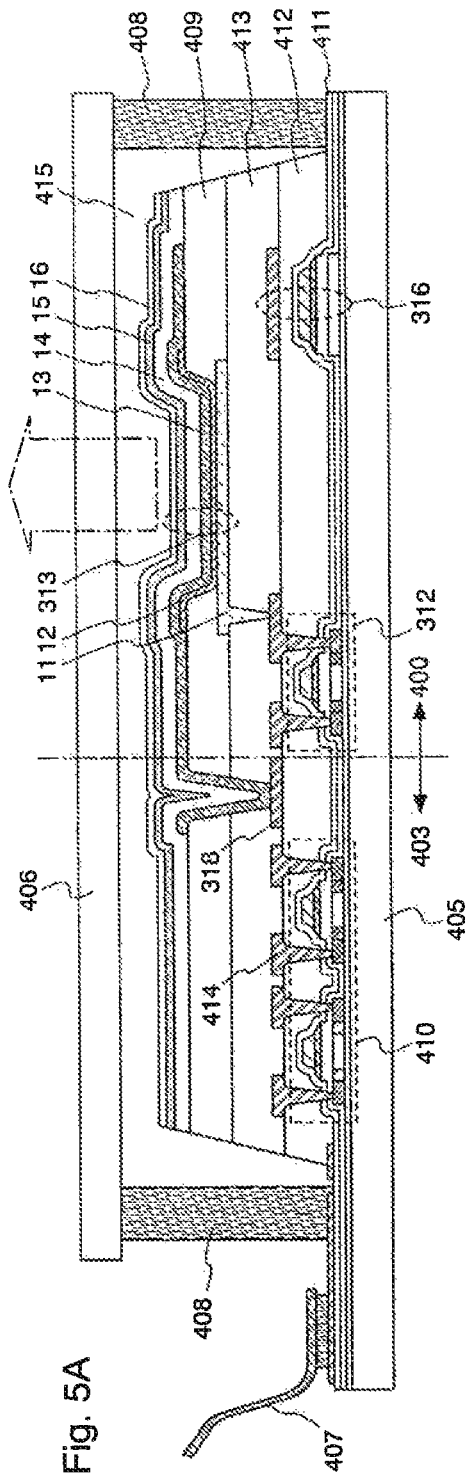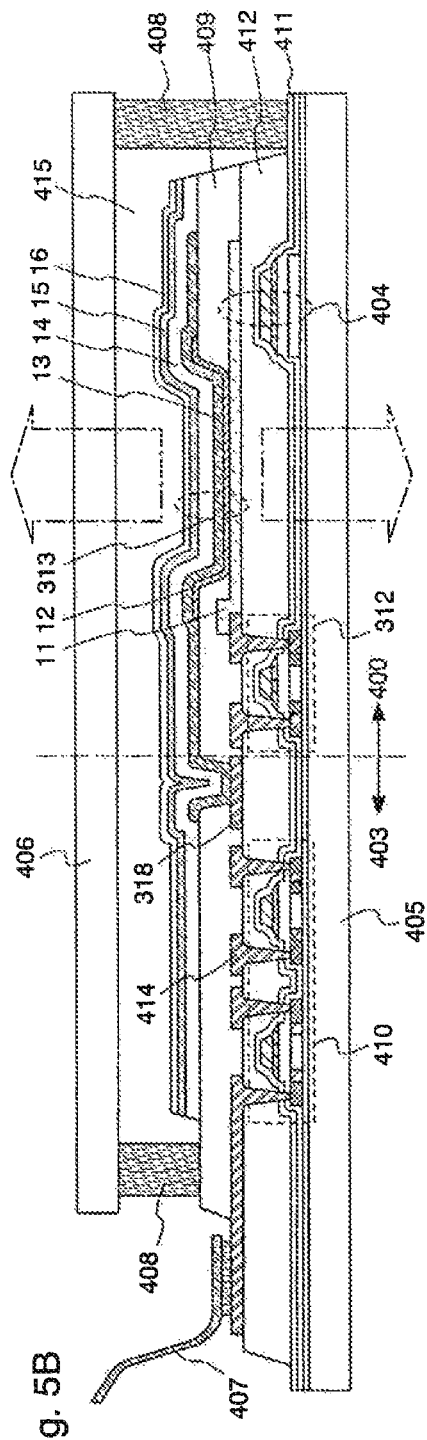

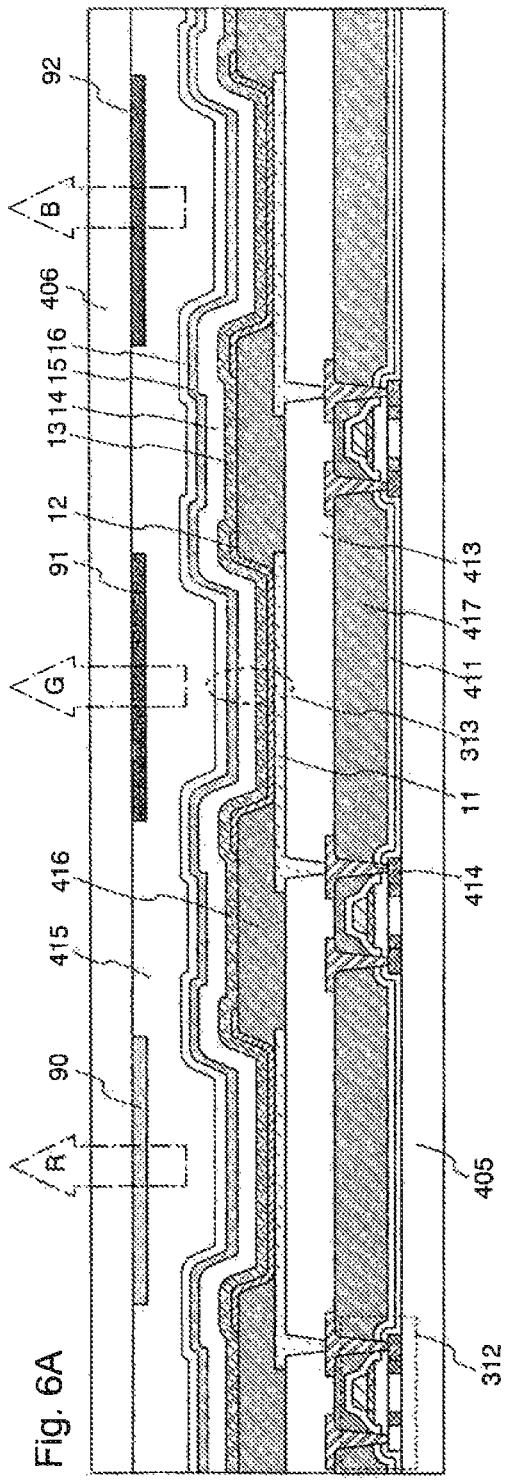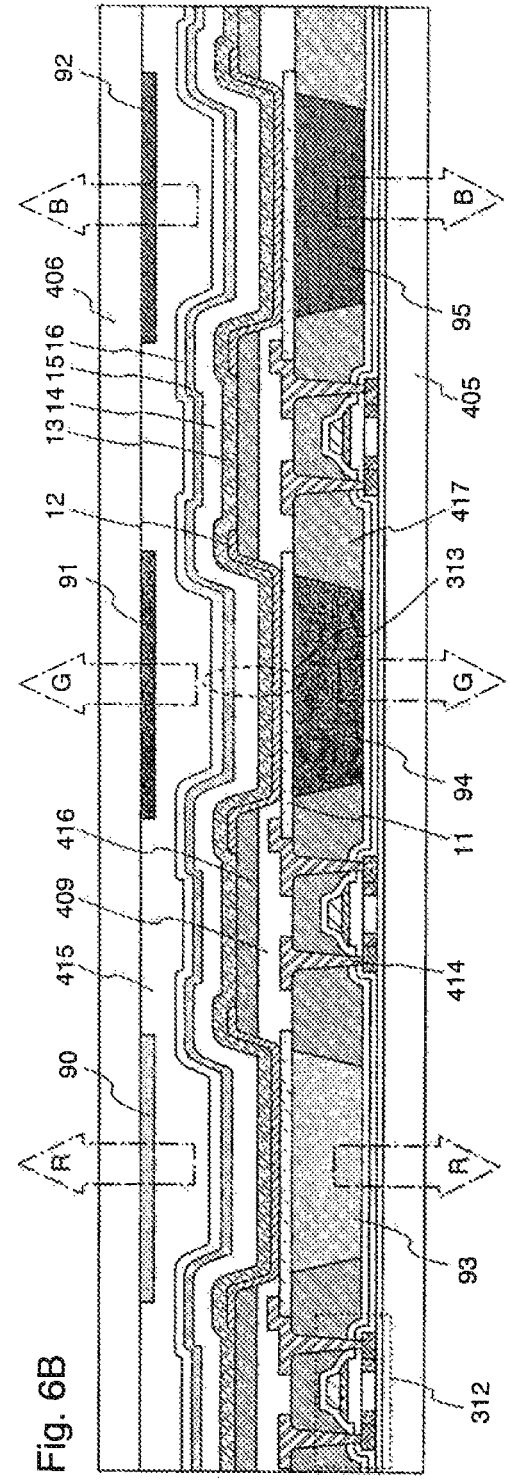

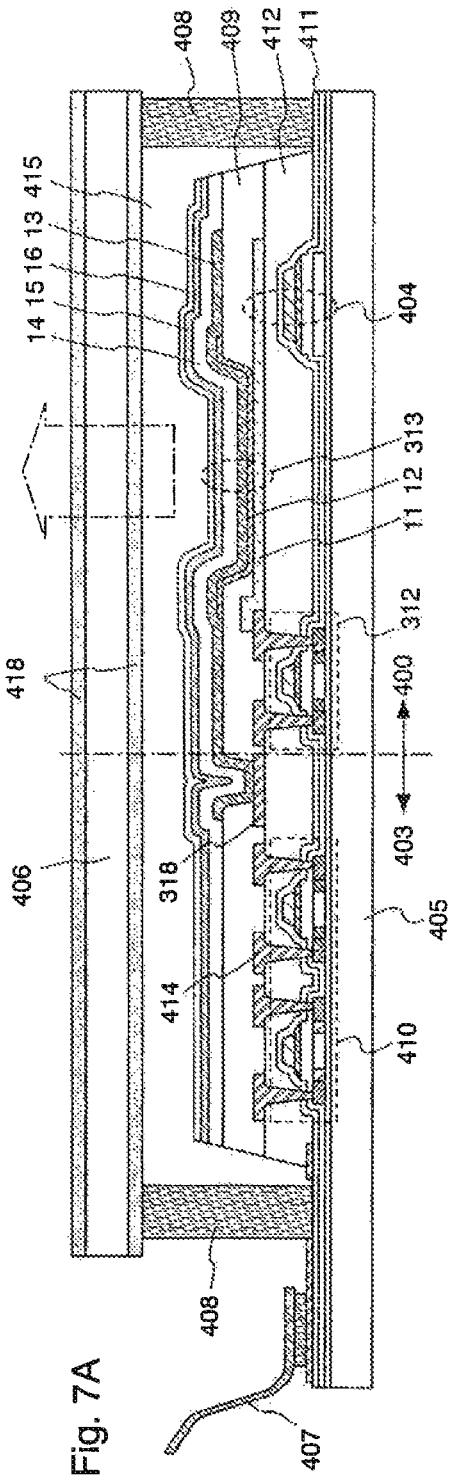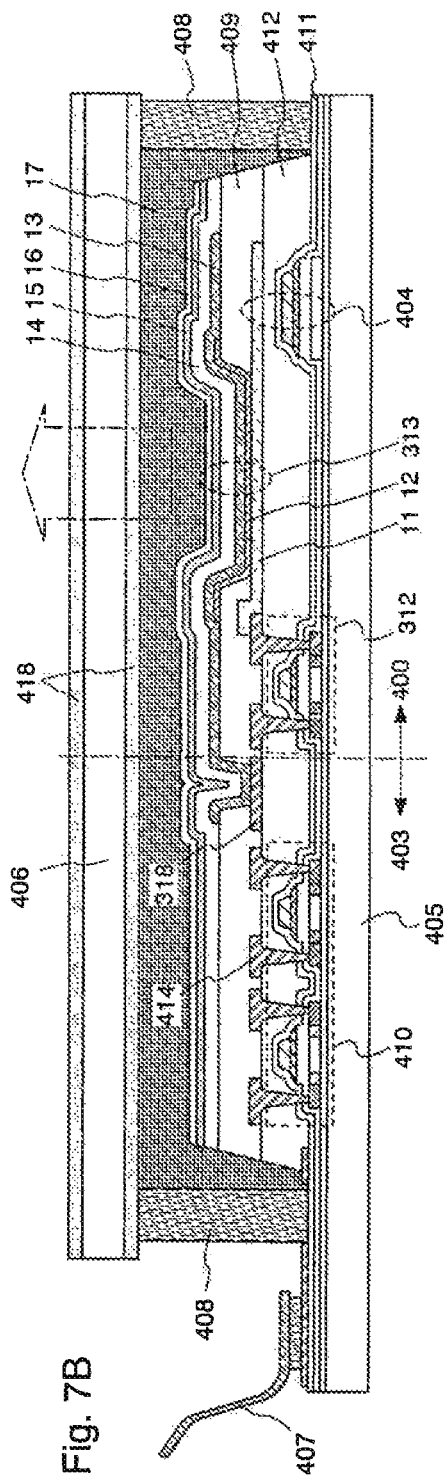
Fig. 7A
Fig. 7B

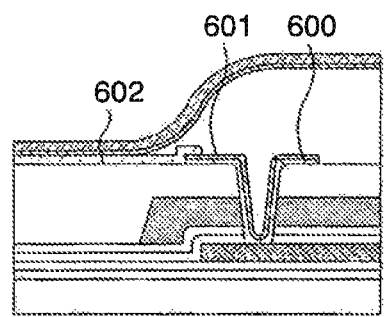
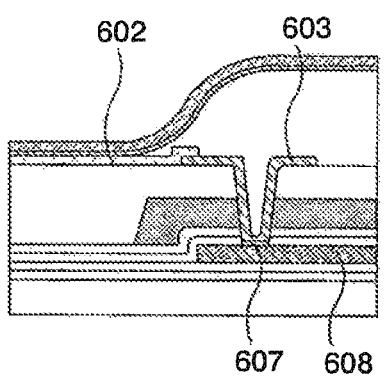
Fig. 9A    Fig. 9B
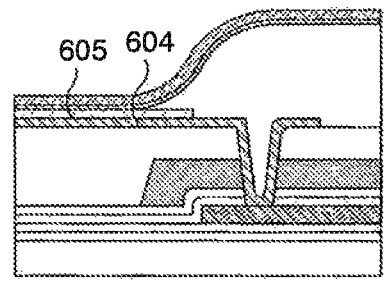
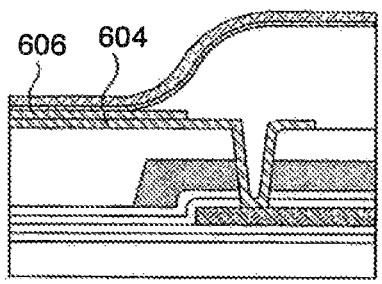
Fig. 9C    Fig. 9D

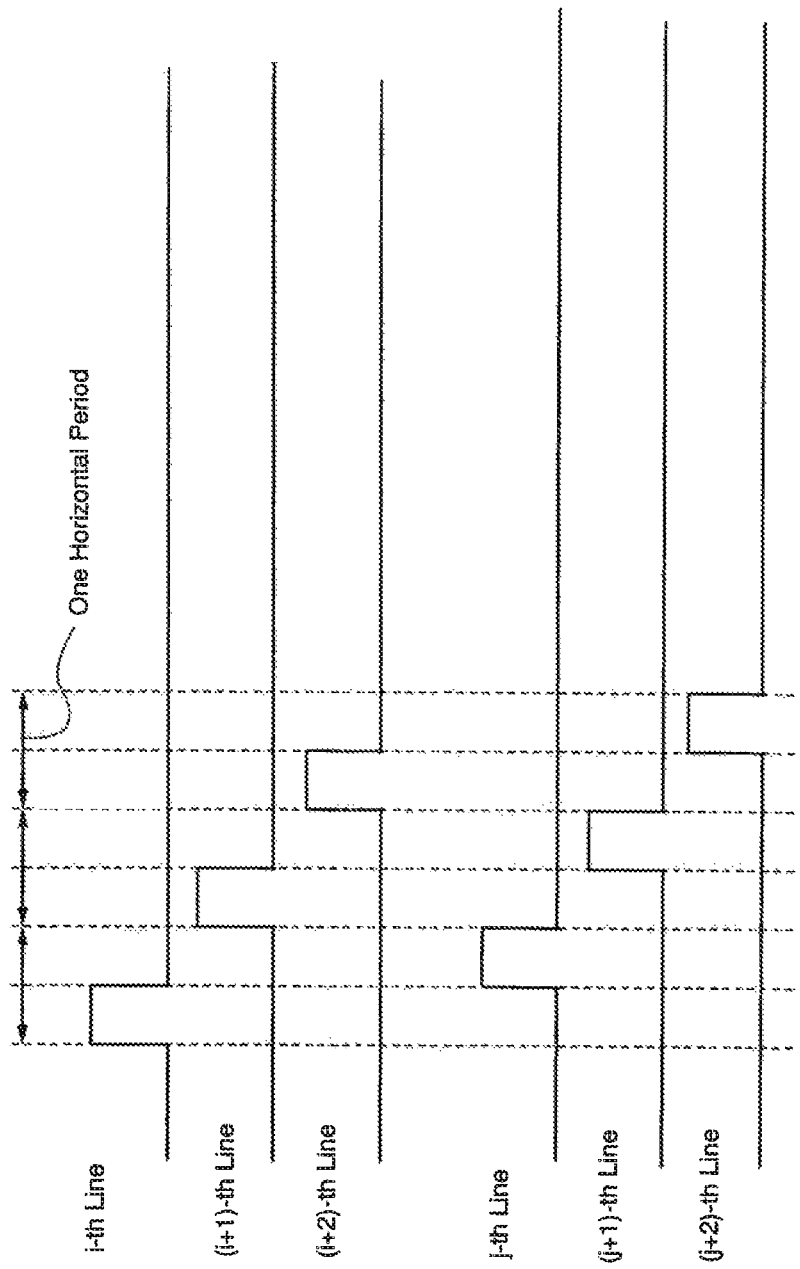

LIGHT-EMITTING DEVICE HAVING WHITE LIGHT EMISSION

CROSS-REFERENCE TO RELATED APPLICATIONS

This application is a continuation of U.S. application Ser. No. 15/473,711, filed Mar. 30, 2017, now allowed, which is a continuation of U.S. application Ser. No. 15/157,499, filed May 18, 2016, now U.S. Pat. No. 9,614,012, which is a continuation of U.S. application Ser. No. 14/819,550, filed Aug. 6, 2015, now U.S. Pat. No. 9,349,775, which is a continuation of U.S. application Ser. No. 14/460,426, filed Aug. 15, 2014, now U.S. Pat. No. 9,105,855, which is a continuation of U.S. application Ser. No. 14/197,442, filed Mar. 5, 2014, now U.S. Pat. No. 8,809,891, which is a continuation of U.S. application Ser. No. 13/875,491, filed May 2, 2013, now U.S. Pat. No. 8,669,579, which is a continuation of U.S. application Ser. No, 13/490,516, filed Jun. 7, 2012, now U.S. Pat. No. 8,436,390, which is a continuation of U.S. application Ser. No. 12/706,012, filed Feb. 16, 2010, now U.S. Pat. No. 8,212,280, which is a continuation of U.S. application Ser. No. 11/733,331, filed Apr. 10, 2007, now U.S. Pat. No. 7,696,524, which is a continuation of U.S. application Ser. No. 11/131,437, filed May 18, 2005, now U.S. Pat. No. 7,202,504, which claims the benefit of a foreign priority application filed in Japan as Serial No. 2004-151036 on May 20, 2004, all of which are incorporated by reference.

BACKGROUND OF THE INVENTION

1. Field of the Invention

The present invention relates to a light-emitting element as typified by an organic EL element and a display device having the light-emitting element.

2. Related Art

In recent years, a display device having a light-emitting element as typified by an organic EL (Electro Luminescence) element has been developed and expected to be widely used with taking advantages of a high quality image, a wide viewing angle, and a slim and lightweight shape due to that the display device is a self-luminous type. The "EL element" refers to a light-emitting element that uses a principle that an electroluminescent layer emits light that is interposed between a pair of electrodes by applying current to an anode and a cathode. As the light-emitting element, for example, a so-called top emission light-emitting element having a transparent electrode at a side of an opposite substrate to emit light to the side of the opposite substrate is known. FIG. 17 illustrates a cross-sectional view of the top emission light-emitting element. In FIG. 17, reference numeral 1 denotes a substrate; 2, an electrode; 3, a hole transporting layer; 4, a light-emitting layer; 5, an electron injecting layer; 6, a transparent electrode; 7, a moisture barrier layer; and 8, an antireflection layer. The light-emitting element utilizes light that is radiated when an exciton that is generated by the recombination of electrons injected to the light-emitting element 4 from the transparent electrode 6 via the electron injecting layer 5 and holes injected to the light-emitting layer 4 from the electrode 2 via the hole transporting layer 3 returns to the ground state.

The light-emitting element that extracts light from a top side (opposite substrate side) such as a top emission light-emitting element is required to use the transparent electrode 6 as an opposite electrode. For example, an indium tin oxide (ITO) or the like is used, in which case there is a problem that light extraction efficiency is deteriorated since there is large difference in refractive indexes of the transparent electrode 6 and air around the transparent electrode 6 (patent documents 1 and 2).

Further, a light-emitting element including an organic compound as its main constituent is subject to be deteriorated mainly due to moisture or oxygen. As deterioration due to the moisture or oxygen, luminance is partly lowered or a non emission region is produced. In order to prevent the deterioration, technique of forming a passivation film (moisture barrier layer 7) such as a SiN film for moisture barrier over the transparent electrode 6 is known (a patent document 2). However, there is a problem that light-extraction efficiency is deteriorated since there is large difference in refractive indexes between the SiN film and air even in the case that the passivation film (moisture barrier layer 7) such as a SiN film for moisture barrier is formed over the transparent electrode 6 (a patent document 2).

Technique of forming a film made from a material having a lower refractive index than that of the transparent electrode 6 as an antireflection film 8 in a signal layer or a multi-layer over the transparent electrode 6 or the moisture barrier layer 7 is known toward the foregoing problems (patent documents 1 and 2).

Patent document 1: Unexamined Patent Publication No. 2003-303679

Patent document 2: Unexamined Patent Publication No. 2003-303685

The refractive index of the transparent electrode 6, for example, ITO, is approximately 1.9 to 2.0, whereas the refractive index of the moisture barrier layer 7, for example, a SiN film, formed over the transparent electrode 6 is approximately 2.1 to 2.3, which is higher than that of the transparent electrode 6. In the case that the moisture barrier layer 7 such as a SiN film is formed over the transparent electrode 6, there is still large difference in refractive indexes between the moisture barrier layer 7 and the antireflection layer 8 even when the antireflection layer 8 having a lower refractive index than that of the transparent electrode 6 is formed over the moisture barrier layer 7. Therefore, the reflectivity of an interface between the moisture barrier layer 7 and the antireflection layer 8 is further increased compared to the case that the moisture barrier layer 7 is not provided. Therefore, there is a problem that light extraction efficiency from the light-emitting layer is deteriorated with the increase of reflection loss of light at the interface.

In the case of forming the moisture barrier layer 7, there is a problem that peeling, cracking, and the like due to stress are often occurred, which leads to deterioration of manufacturing yields, lower reliability, and reduction of lifetime of a light-emitting element.

SUMMARY OF THE INVENTION

It is an object of the present invention to solve at least one problem among the foregoing problems. It is more specific object of the present invention to provide a light-emitting element having high reliability and a display device using the light-emitting element resistant to peeling, cracking, or the like even if a passivation film is provided over a transparent electrode. It is another object of the present invention to provide a light-emitting element that has high light extraction efficiency from a light-emitting layer and a display device using the light-emitting element. It is further another object of the present invention to provide a light-emitting element that can solve all of the foregoing problems simultaneously and a display device using the light-emitting element.

According to the present invention, a light-emitting element comprises a pixel electrode, an electroluminescent layer, a transparent electrode, a passivation film, a stress relieving layer, and a low refractive index layer, all of which are stacked sequentially. The stress relieving layer serves to prevent peeling of the passivation film. The low refractive index layer serves to reduce reflectivity of light generated in the electroluminescent layer in emitting to air to improve light extraction efficiency. Each of the pixel electrode and the transparent electrode serves as an anode or a cathode for supplying electrons or holes to the electroluminescent layer. The passivation film serves to prevent impurities such as moisture from penetrating into the transparent electrode or the electroluminescent layer. The passivation film, the stress relieving layer, or the low refractive index layer may have a lamination layer structure. Further, the stress relieving layer may be provided between the transparent electrode and the passivation film. The electroluminescent layer may have a single layer structure or a lamination layer structure.

According to the present invention, a light-emitting element comprises a pixel electrode, an electroluminescent layer, a transparent electrode, a passivation film, a stress relieving layer, and a low refractive index layer, all of which are stacked sequentially, in which a refractive index of the low refractive index layer is smaller than that of the stress relieving layer. The low refractive index layer serves to reduce the difference in refractive indexes between the stress relieving layer and space. (The space is filled with a filling gas such as air or nitrogen. The same applies hereinafter.)

According to the present invention, a light-emitting element comprises a pixel electrode, an electroluminescent layer, a transparent electrode, a stress relieving layer, a passivation film, and a low refractive index layer, all of which are stacked sequentially.

According to the present invention, a light-emitting element comprises a pixel electrode, an electroluminescent layer, a transparent electrode, a first stress relieving layer, a passivation film, a second stress relieving layer, and a low refractive index layer, all of which are stacked sequentially. A refractive index of the low refractive index layer may be smaller than that of the second stress relieving layer.

According to the present invention, a display device comprises a transistor provided over a substrate; and a light-emitting element connected to the transistor via an interlayer insulating film; wherein the light-emitting element is formed by sequentially stacking a pixel electrode, an electroluminescent layer, a transparent electrode, a passivation film, a stress relieving layer, and a low refractive index layer. Here, the transistor serves to control ON/OFF of the light-emitting element; however, a transistor having another function may be included in the display device. As the transistor, a thin film transistor (TFT) is, but not exclusively, used generally. The interlayer insulating film is an insulating film that separates the transistor from the light-emitting element. The interlayer insulating film may have either a single layer structure or a lamination layer structure. The stress relieving layer serves to prevent peeling of the passivation film. The low refractive index layer serves to reduce reflectivity of light generated in the electroluminescent layer in emitting to air to improve light extraction efficiency. A refractive index of the low refractive index layer is preferably smaller than that of the stress relieving layer. Each of the pixel electrode and the transparent electrode serves as an anode or a cathode for supplying electrons or holes to the electroluminescent layer. The passivation film serves to prevent impurities such as moisture from penetrating into the transparent electrode or the electroluminescent layer. The passivation film, the stress relieving layer, or the low refractive index layer may have a lamination layer structure.

According to the present invention, a display device comprises a transistor provided over a substrate; and a light-emitting element connected to the transistor via an interlayer insulating film; wherein the light-emitting element is formed by sequentially stacking a pixel electrode, an electroluminescent layer, a transparent electrode, a stress relieving layer, a passivation film, and a low refractive index layer.

According to the present invention, a display device comprises a transistor provided over a substrate; and a light-emitting element connected to the transistor via an interlayer insulating film; wherein the light-emitting element is formed by sequentially stacking a pixel electrode, an electroluminescent layer, a transparent electrode, a first stress relieving layer, a passivation film, a second stress relieving layer, and a low refractive index layer; and a refractive index of the low refractive index layer is smaller than that of the second stress relieving layer.

In the display device according to the present invention, the light-emitting element may be sealed with an opposite substrate via a filling layer. Here, a refractive index of the filling layer is preferably almost the same as that of refractive indexes of a low refractive index layer and an opposite substrate or intermediate between those of the low refractive index layer and the opposite substrate. The filling layer may be a liquid layer or a solid layer that has at least a lager refractive index than that of air (or a filling gas such as nitrogen).

The light-emitting element according to the present invention can increase the thickness of a passivation film without being adversely affected by peeling, cracking, or the like of the passivation film since a stress relieving layer is formed on a top surface or a bottom surface of the passivation film. As a result, an extreme high blocking effect can be obtained. Therefore, a light-emitting element having high reliability and long lifetime can be provided at high manufacturing yields.

In the case that the stress relieving layer is formed over a top surface (both surfaces) of the passivation film, the difference in refractive indexes between the stress relieving layer and air can be reduced by forming the low refractive index layer to have a lower refractive index than that of the stress relieving layer. As a result, efficiency of light extraction to the outside can be improved.

The display device according to the present invention can increase the thickness of a passivation film without being adversely affected by peeling, cracking, or the like of the passivation film since a light-emitting element has a stress relieving layer over a top surface or a bottom surface of the passivation film. As a result, an extreme high blocking effect can be obtained. Therefore, a display device having high reliability and long lifetime can be provided at high manufacturing yields.

In the case that the low refractive index layer is formed to have a lower refractive index than that of the stress relieving layer, the difference in refractive indexes between the stress relieving layer and air can be reduced. Moreover, efficiency of light extraction to the outside can be further improved in the case that a filling layer is formed between the low refractive index layer and the opposite substrate. These and other objects, features and advantages of the present invention will become more apparent upon reading of the following detailed description along with the accompanied drawings.

BRIEF DESCRIPTION OF THE DRAWINGS

FIGS. 5A and 5B are cross-sectional views for showing a display device according to the present invention;

FIGS. 6A and 6B are cross-sectional views for showing a display device according to the present invention (in which a color filter is provided);

FIGS. 7A and 7B are cross-sectional views for showing a display device according to the present invention (in which a low refractive index layer is provided to an opposite substrate);

FIGS. 9A to 9D are cross-sectional views for showing a wiring formed to have a lamination layer structure;

FIG. 18 is an explanatory view of a method for selecting a plurality of gate signals simultaneously in one horizontal period.

DESCRIPTION OF THE INVENTION

Embodiments according to the present invention will be explained in detail with reference to the drawings. Through the drawings of the embodiments, like components are denoted by like numerals in common with the different drawings.

As used herein, the term "light-emitting element" refers to an element that comprises a passivation film, a stress relieving film, a low refractive index layer, and the like, which are characterizing portions of the present invention, formed over an anode or a cathode, in addition to a general element that comprises a electroluminescent layer interposed between the anode and the cathode. In other words, the term "light-emitting element" includes the portion that serves to decrease a refractive index of a portion through which light passes and relieve stress of the passivation film. In the case of explaining various compound materials by using a chemical formula in this specification, a material having an arbitrary composition ratio can be appropriately selected unless otherwise stated (for example, "SiN" means SixNy (x, y>0). Further, the refractive index may be abbreviated to "n" in this specification.

Embodiment 1

Figure 1A:
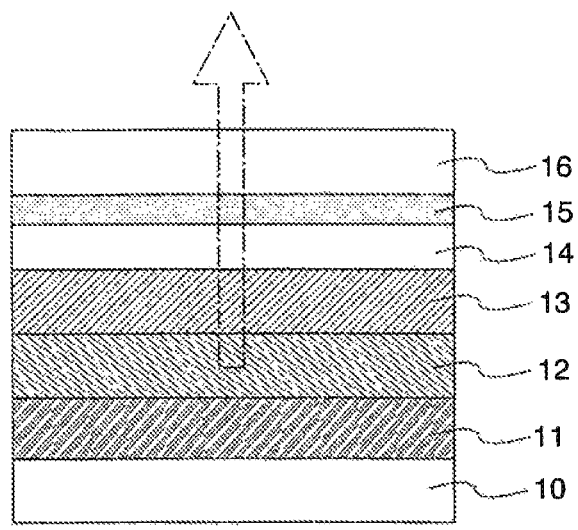
FIGS. 1A and 1B are explanatory views for showing a structure of a light-emitting element according to the present invention.

A structure of a light-emitting element according to this embodiment is explained with reference to FIG. 1A. FIG. 1A illustrates a schematic cross-sectional view of the light-emitting element according to this embodiment. The light-emitting element according to this embodiment comprises a pixel electrode 11, an electroluminescent layer 12, a transparent electrode 13, a passivation film 14, a stress relieving layer 15, and a low refractive index layer 16 as illustrated in FIG. 1A. The light-emitting element is generally provided over a substrate 10. The light-emitting element according to this embodiment is capable of emitting light to the top (so-called top emission), which comprises the passivation film 14 formed over the transparent electrode 13, the stress relieving layer 15 formed over the passivation film 14, and the low refractive index layer 16 formed over the stress relieving layer 15. The present invention can be applied to a top emission light-emitting element and a dual emission light-emitting element by which light is emitted to top and bottom surfaces of a light-emitting layer. FIG. 1A illustrates only light emitted to the top for descriptive purposes. Hereinafter, the light-emitting element is explained specifically.

The substrate 10 is a substrate having an insulating surface made from, but not exclusively, glass, quartz, plastic, or the like. In the case of using a plastic substrate, any substrate having flexibility can be used. For instance, a substrate made from one kind plastic selected from the group consisting of polyethylene terephthalate (PET), polyether sulfone (PES), polyethylenenaphthalate (PEN), polycarbonate (PC), nylon, polyetheretherketone (PEEK), polysulfone (PSF), polyetherimide (PEI), polyarylate (PAR), polybutylene terephthalate (PBT), and polyimide.

The pixel electrode 11 is provided over the substrate 10. The top emission type uses a metal material having reflectivity as the pixel electrode 11 despite of the polarity of the pixel electrode 11. For instance, in the case that the pixel electrode 11 serves as a cathode, a transparent conductive film formed by co-evaporation of an element such as Al, AlLi, MgAg, MgIn, Ca, or an element belonging to 1 or 2 group in the periodic table, and aluminum. These materials are suitable for a cathode material since they have small work functions and electrons are easily extracted therefrom. In this case, the light-emitting element is formed by sequentially stacking the cathode, an electroluminescent layer, and an anode over the substrate. The lamination layer structure is referred to as a reverse stacked structure.

In the case that the pixel electrode 11 serves as an anode, an element selected from the group consisting of Cr, Ti, TiN, TlSixNy, Ni, W, WSix, WNx, WSixNy, NbN, Pt, Zn, Sn, In, and Mo, or a film or a laminated film made from an alloy material or a compound material containing the foregoing elements as its main component may be used for the pixel electrode 11. In this case, the light-emitting element is formed by stacking sequentially an anode, an electroluminescent layer, and a cathode over a substrate. The lamination layer structure is referred to as a forward stacked structure.

On the other hand, a dual emission type uses a metal material having a light transmitting property as the pixel electrode 11 since light is required to be emitted to the bottom. Typically, ITO is used. ITO is generally used as an anode, in which case a structure of a light-emitting element is a forward stacked structure. In the case that the pixel electrode serves as a cathode, ITO is used to ensure transparency, and a thin film such as Li that is a cathode material may be formed between the ITO and the electroluminescent layer 12. Instead of ITO, a transparent conductive film such as ITSO (indium tin silicon oxide, mixture of ITO and silicon oxide), ZnO (zinc oxide), GZO (zinc oxide doped with gallium), or IZO (indium zinc oxide, mixture of an indium oxide and a zinc oxide of approximately 1 to 20%) can be used.

Further, a barrier layer including silicon, silicon oxide, silicon nitride, or the like can be interposed between the transparent conductive film such as ITO and the electroluminescent layer 12. Accordingly, it is experimentally found that luminous efficiency is increased. The pixel electrode 11 may be an electrode having an antireflection function formed by covering a Cr film or the like both or either of surfaces of the ITO or the like. Hence, outside light or emission of light can be prevented from reflecting off the pixel electrode 11 and interfering with light extracted to the outside.

Figure 17:
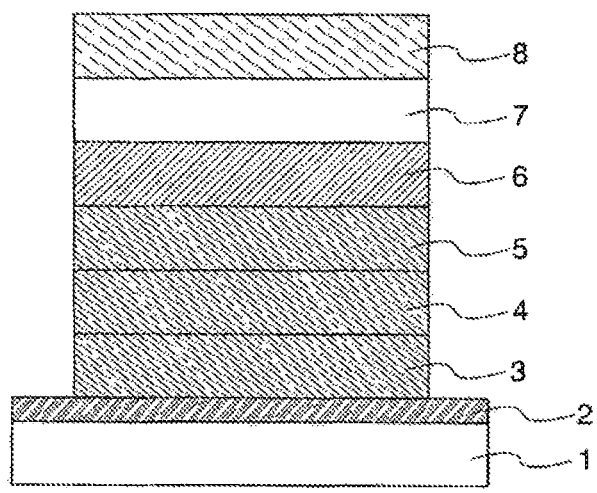
FIG. 17 is an explanatory view of a structure of a conventional light-emitting device.

The electroluminescent layer 12 is formed over the pixel electrode 11. In the case of forward stacked structure, the electroluminescent layer 12 may have a lamination layer structure composed of a hole transporting layer 3, a light-emitting layer 4, and an electron injecting layer 5 as described in the conventional example (FIG. 17), alternatively, the electroluminescent layer 12 may have a single layer structure composed of only a light-emitting layer. In the case of forming the electroluminescent layer 12 by a plurality of layers, the electroluminescent layer 12 may have the structure formed by stacking sequentially 1) anode/hole injecting layer/hole transporting layer/light-emitting layer/electron transporting layer/cathode, 2) anode/hole injecting layer/light-emitting layer/electron transporting layer/cathode, 3) anode/hole injecting layer/hole transporting layer/light-emitting layer/electron transporting layer/electron injecting layer/cathode, 4) anode/hole injecting layer/hole transporting layer/light-emitting layer/hole blocking layer/electron transporting layer/cathode, 5) anode/hole injecting layer/hole transporting layer/light-emitting layer/hole blocking layer/electron transporting layer/electron injecting layer/cathode, or the like. The foregoing structures are forward stacked structures. In the case of forming a reverse stacked structure, the order of stacking may be reversed.

The electroluminescent layer 12 that can be thought as a center of a light-emitting element is generally composed of an organic compound layer. All of the foregoing hole injecting layer, hole transporting layer, light-emitting layer, electron transporting layer, electron injecting layer, and the like are included in the electroluminescent layer 12. As a material for composing the electroluminescent layer 12, a low molecular organic or inorganic compound material, an intermediate molecular organic or inorganic compound material, or a high molecular (polymer) organic or inorganic compound material can be used, alternatively, a material that is combination of the foregoing materials can be used. Generally, the handling of the high molecular organic compound material is easier, and heat resistance of the high molecular organic compound material is higher than those of the low molecular organic compound material. Further, a mixed layer that is formed by appropriately mixing the electron transporting material to the hole transporting material or a mixed junction formed by providing a mixed region to each connection interface can be formed. A fluorescent dye or the like can be doped to the light-emitting layer. As a method for depositing the organic compounds, a vapor deposition method, a spin coating method, and an ink jetting method are known. Especially, the spin coating method or the ink jetting method is preferably used to realize full color display with the use of a high molecular material.

In order to improve reliability, deaeration is preferably carried out by vacuum heating (100 to 250° C.) immediately prior to forming the electroluminescent layer 12. For instance, vapor deposition is carried out in a deposition chamber that is evacuated to vacuum of 0.665 Pa ($5 \times 10^{-3}$ Torr) or less, preferably, $1.33 \times 10^{-2}$ to $1.33 \times 10^{-4}$ ($10^{-4}$ to $10^{-6}$ Torr). In a vacuum deposition process, an organic compound is vaporized in advance by resistance heating to disperse in the direction of a substrate upon opening a shutter. The vaporized organic compound disperses upward to be deposited over a substrate through an opening portion provided to a metal mask. For instance, white emission can be obtained by stacking sequentially $Alq_3$ (hereinafter, $Alq_3$ may be referred to as Alq), $Alq_3$ partly doped with Nile red that is a red emission dye, p-EtTAZ, and TPD (aromatic diamine) by a vapor deposition method.

In the case that the electroluminescent layer 12 is formed by a coating method using a spin coating method, a material is preferably baked by vacuum heating after the material is coated. For instance, an aqueous solution of poly(ethylene dioxythiophene)/poly(styrene sulfonic acid) (PEDOT/PSS) that serves as a hole injecting layer may be applied to an entire surface to be baked. Then, a polyvinyl carbazole (PVK) solution doped with a luminescent center pigment (such as 1,1,4,4-etraphenyl-1,3-butadiene (TPB), 4-dicyanomethylene-2-methyl-6-(p-dimethylamino-styryl)-4H-pyran (DCM1), Nile red, or coumarin 6) that serves as a light emitting layer may be coated over the entire surface to be baked. Water is used as the solvent of PEDOT/PSS. The PEDOT/PSS is not soluble in an organic solvent. Accordingly, the PEDOT/PSS is not resoluble even when PVK is coated thereover. Since the solvents used for PEDOT/PSS and PVK are different from each other, the PEDOT/PSS and the PVK do not preferably share one chamber. The electroluminescent layer 12 can be formed to have a single layer, in which case, a 1,3,4-oxadiazole derivative (PBD) having an electron transporting property may be dispersed in polyvinyl carbazole (PVK) having a hole transporting property. In addition, white light emission can be obtained by dispersing 30 wt % of PBD as an electron transporting agent and dispersing four kinds of pigments (TPB, coumarin 6, DCM1, and Nile red) in appropriate amounts.

An example of a light-emitting element exhibiting white emission is explained here. Needless to say, a light-emitting element that can exhibit red emission, green emission, or blue emission can be manufactured by selecting appropriately materials of the electroluminescent layer 12, in which case, a color filter as illustrated in FIG. 6 can be omitted. The emission mechanism of a light-emitting element is generally considered that voltage is applied to an organic compound layer interposed between a pair of electrode, and electrons injected from a cathode and holes injected from an anode are recombined with each other in an emission center in an organic compound layer to form molecular excitons, then, the molecular excitons radiate energy to emit light while returning to a ground state. An excited state is known as a single excitation and a triplet excitation, both of which can be applied to a light-emitting element according to the present invention.

For instance, light emission (phosphorescence) from a triplet excitation state is used, CBP+Ir (ppy)$_3$ made from carbazole can be used as an organic compound (also referred to as a triplet compound) that can exhibits phosphorescence. The phosphorescence has advantages of having higher luminous efficiency than that of emission (fluorescence) from a singlet excitation state and capable of operating emitting light at the same level of luminance as fluorescence at lower operation voltage (that is required to emit an organic light-emitting element).

A transparent electrode 13 is formed over the electroluminescent layer 12. In the case that the transparent electrode 13 serves as an anode, a transparent conductive film such as ITO may be used. On the other hand, in the case that the transparent electrode 13 serves as a cathode, a thin film such as Li that is a cathode material may be formed between the transparent electrode 13 and the electroluminescent layer 12.

A passivation film 14 is formed over the transparent electrode 13. The passivation film 14 is preferably formed by a single layer or a lamination layer made from silicon nitride (typically, Si$_3$N$_4$), silicon oxide (typically, SiO$_2$), silicon nitride oxide (SiNO (composition ratio: N>O)), silicon oxynitride ((composition ratio: N<O)), thin film including carbon as its main component (DLC (Diamond Like Carbon) film, CN film, and the like), or the like. The passivation film 14 made from nitrides has fine membrane quality, and so it protects the transparent electrode 13 and has an extreme high blocking effect against moisture, oxygen, and impurities, which deteriorate the electroluminescent layer 12.

As noted above, the passivation film 14 has a high blocking effect; however, the passivation film 14 is subject to peeling or cracking when the thickness and the membrane stress are increased. The peeling and the like of the passivation film can be prevented by providing the stress relieving layer 15 over the passivation film 14. As the stress relieving film 15, an organic material or an inorganic material having small stress is appropriately selected to be used. It is preferable that the material for the stress relieving film has a lower refractive index than that of the transparent electrode 13 or the passivation film 14. For instance, polyimide resin, acrylic resin, or styrene resin can be used. Moreover, polyamide, polyimideamide, resist or benzocyclobutene, or an SOG film obtained by a coating method (for example, an SiOx film including a an alkyl group formed by a coating method using a siloxane coated film (The siloxane is composed of a skeleton formed by the bond of silicon (Si) and oxygen (O), in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent.) or SiOx film using a polysilazane coated film) or a material that is identical or similar to an organic material used for the electroluminescent layer can be used.

As described above, the thickness of the passivation film 14 can be increased without being adversely affected by peeling or cracking of the passivation film 14 by providing the stress relieving layer 15. As a result, an extreme high blocking effect can be obtained. A material for forming the stress relieving film includes a material serving as the passivation film 14. When the stress relieving film is made from such the material serving as the passivation film 14, the stress relieving film can be included in a stress relieving film as long as the formed stress relieving film has a function as a stress relieving film (that is, a function capable of preventing pealing, cracking, or the like as a result or a function of preventing pealing, cracking, or the like or a function capable of preventing pealing, cracking, or the like actually by being formed over a material having a comparative large membrane stress). For instance, the case that SiO$_2$ (refractive index n is approximately equal to 1.5) or SiNO (n is approximately equal to 1.8) is formed as a stress relieving layer (and a passivation layer) in the case that SiN (refractive index a is equal to 2.1 to 2.3) is formed as the passivation film can be nominated.

The low refractive index layer 16 is provided over the stress relieving layer 15. As used herein, the term "low refractive index layer" refers to a layer having a lower refractive index than that of the stress relieving layer 15 and a higher refractive index than that of the outside atmosphere of the light-emitting element (generally, n is equal to 1). The outside atmosphere may be air or atmosphere filled with nitrogen gas or the like.

In the case that the stress relieving layer 15 is formed over the passivation film 14, suppose that refractive indexes of the transparent electrode 13, the passivation film 14, the stress relieving layer 15, and the low refractive index layer 16 are $n_T$, $n_P$, $n_B$, and $n_L$ respectively, the relationships of the refractive indexes are preferably as follows.

If $n_T<n_P$, $n_P>n_B>n_L$ is fulfilled.          1)

If $n_T>n_P$, $n_T>n_B>n_L$ is fulfilled.          2)

More preferably, $n_P>n_B>n_L$ or $n_P\approx n_B>n_L$ (that is, the relation that the refractive index is gradually lowered from the transparent electrode 13 to the refractive index layer 16 is fulfilled).

In the case of using ITO as the transparent electrode 13, the refractive index is 1.9 to 2.0. In the case of using SiN as the passivation film 14, the refractive index is 2.1 to 2.3. In the case of using SiNO as the passivation film 14, the refractive index is approximately 1.8 In the case of using SiO$_2$ as the passivation film 14, the refractive index is approximately 1.5. Therefore, the following are the refractive indexes of materials used for forming the stress relieving film 15, that is, polyimide resin (n=1.50 to 1.55), acrylic resin (n=1.45 to 1.50), styrene resin (n=1.55 to 1.60), magnesium fluoride (MgF$_2$, n=1.38 to 1.40), barium fluoride (BaF$_2$, n=1.47), and an organic material used for an electroluminescent layer (n is approximately equal to 1.6). Further, MgO (n=1.64 to 1.74), SrO$_2$, and SrO are suitable for the stress relieving layer 15 since they have a light-transmitting property and a hygroscopic property and can be formed into a thin film by vapor deposition.

In the case that an organic material is used for forming the stress relieving layer 15, α-NPD 4,4'-bis(N-(1-naphthyl)-N-phenylamino)biphenyl, BCP (bathocuproine), MTDATA 4,4',4"-tris[N-(3-methylphenyl)-N-phenylamino]triphenylamine, Alq$_3$ (tris(8-quinolinolato)aluminum complex, or the like can be used as the organic material. The foregoing organic materials have a hygroscopic property and almost transparent if the material is formed to have a thin film thickness.

As the low refractive index layer 16, a material that has a lower refractive index than that of the stress relieving layer 15 such as lithium fluoride (LiF, n=1.30 to 1.39) magnesium fluoride (MgF$_2$, n=1.38 to 1.40), calcium fluoride (CaF$_2$, n=1.23 to 1.45), or barium fluoride (BaF$_2$, n=1.47) may be used.

Materials for the transparent electrode 13, the passivation film 14, the stress relieving layer 15, and the low refractive index layer 16 are not limited to the foregoing materials. Any material that fulfills the relations of 1) and 2) can be used. The material used that fulfills any relation among the foregoing in equations 1) and 2) with respect to the refractive indexes of the transparent electrode 13, the passivation film 14, the stress relieving layer 15, and the low refractive index layer 16 can reduce the difference in refractive indexes of interfaces between these layers and improve light extraction efficiency to the outside.

The transparent electrode 13, the passivation film 14, the stress relieving layer 15, and the low refractive index layer 16 can be formed by a sputtering method, a CVD method, a vapor deposition method, or the like. For instance, it is preferable that the transparent electrode 13 is formed by a sputtering method, the passivation film 14 is formed by a CVD method, and the stress relieving layer 15 and the low refractive index layer 16 are formed by a vapor deposition method. In this case, by adopting a multi-chamber system composed of an integrated combination of a sputter deposition chamber, a CVD deposition chamber, vapor deposition chamber, and a bake chamber for drying processing, film formation can be efficiently carried out by transporting a substrate to each of the chambers.

As described above, a light-emitting element according to the present invention has the stress relieving layer 15 over the passivation film 14, and so the thickness of the passivation film 14 can be increased without being adversely affected by the peeling and cracking of the passivation film 14. As a result, an extreme high blocking effect can be obtained.

The stress relieving layer 15 has a refractive index intermediate between those of the passivation film 14 or the transparent film 13, and the low refractive index layer 16, and so the stress relieving layer 15 can reduce the difference in refractive indexes of interfaces between the transparent electrode 13, the passivation film 14, the stress relieving layer 15, and the low refractive index layer 16.

A light-emitting element according to the present invention can be adopted in a light-emitting device as typified by an EL display. The light-emitting device can be broadly divided into two kinds, that is, a simple matrix system in which an electroluminescent layer is formed between two kinds of stripe-shaped electrodes provided so as to be right angles with each other, and an active matrix system in which an electroluminescent layer is formed between a pixel electrode and an opposite electrode arranged in a matrix configuration and connected to TFT. The light-emitting element according to the present invention can be applied to either of the simple matrix system and the active matrix system.

Embodiment 2

Figure 1B:
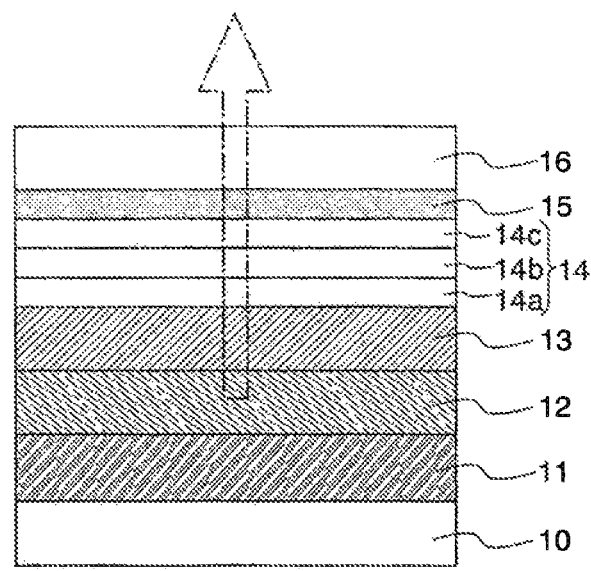

A structure of a light-emitting element according to this embodiment is explained with reference to FIG. 1B. FIG. 1B is a schematic cross-sectional view of the light-emitting element according to this embodiment. The characteristic feature of the present invention relating to this embodiment is a passivation film 14 having a lamination layer structure. The structure illustrated in FIG. 1B has a three-layer structure formed by stacking sequentially a silicon nitride film 14a, a silicon oxide film 14b, and a silicon nitride film 14c. The second layer, SiO$_2$ film, combines a function as a passivation film and a function of preventing peeling or cracking of a SiN film (function as a stress relieving film). By forming the passivation film to have a three-layer structure, a barrier property of the passivation film is improved and penetration of impurities such as moisture or oxygen into a transparent electrode 13 or an electroluminescent layer 12 can be effectively prevented.

A structure of the passivation film 14 is not limited to that illustrated in FIG. 1B. The passivation film 14 is preferably formed to have a structure so that difference in refractive indexes of interfaces of layers that construct the passivation film 14. Moreover, a stress relieving layer 15 and a low refractive index layer 16 are formed over the passivation layer 14. The stress relieving layer 15 only has to fulfill the relations of 1) and 2) in Embodiment 1 with respect to the top layer of the passivation film 14. In the case that the stress relieving layer 15 is formed to have a lamination layer structure using the material described in Embodiment 1, the low refractive index layer 16 only has to fulfill the relations of 1) and 2) in Embodiment 1 with respect to the top layer of the stress relieving layer 15. The other structure of the light-emitting element according to this embodiment can be referred to Embodiment 1.

Because of forming the passivation film 14 to have a lamination structure, the light-emitting element according to the present invention has an improved barrier property and can prevent effectively impurities such as moisture or oxygen from penetrating into the transparent electrode 13 or the electroluminescent layer 12. The light-emitting element has the stress relieving layer 15 over the passivation film 14, and so the thickness of the passivation film 14 can be increased without being adversely affected by the peeling and cracking of the passivation film 14. As a result, an extreme high blocking effect can be obtained.

The stress relieving layer 15 has a refractive index intermediate between those of the passivation film 14 or the transparent film 13, and the low refractive index layer 16 according to the relations of 1) and 2) in Embodiment 1, and so the stress relieving layer 15 can reduce the difference in refractive indexes of interfaces between the transparent electrode 13, the passivation film 14, the stress relieving layer 15, and the low refractive index layer 16.

A light-emitting element according to the present invention can be adopted in a light-emitting device as typified by an EL display. The light-emitting device can be broadly divided into two kinds, that is, a simple matrix system in which an electroluminescent layer is formed between two kinds of stripe-shaped electrodes provided so as to be right angles with each other, and an active matrix system in which an electroluminescent layer is formed between a pixel electrode and an opposite electrode arranged in a matrix configuration and connected to TFT. The light-emitting element according to the present invention can be applied to either of the simple matrix system and the active matrix system.

Embodiment 3

Figure 2:
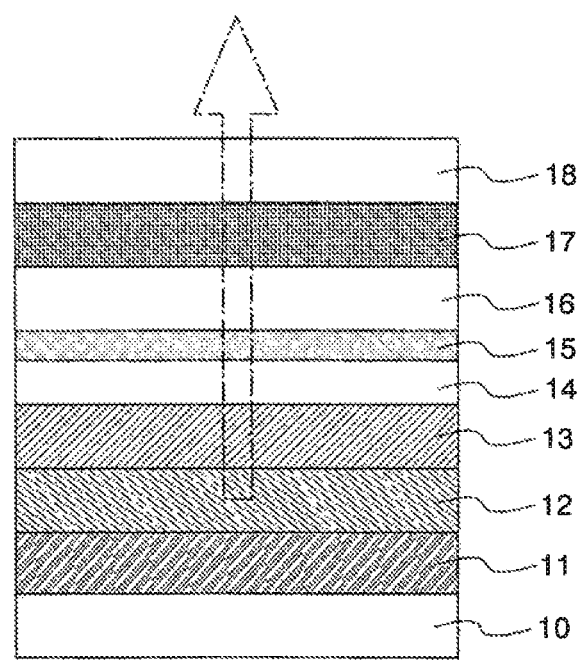
FIG. 2 is an explanatory view for showing a structure of a light-emitting element according to the present invention (in which a filling layer is provided)

A structure of a light-emitting element according to this embodiment is explained with reference to FIG. 2. FIG. 2 is a schematic cross-sectional view of the light-emitting element according to this embodiment. The characteristic feature of the present invention relating to this embodiment is that space between a low refractive index layer 16 and an opposite substrate 18 is filled with a filling layer 17. The filling layer 17 has preferably a refractive index that is almost the same as those of a low refractive index layer 16 and an opposite substrate 18 or that is intermediate between those of the low refractive index layer 16 and the opposite substrate 18. In the case that the low refractive index layer 16 is made from LiF (n=1.30 to 1.39) and the opposite substrate 18 is formed by a glass substrate (n=1.5), a material having a refractive index of approximately 1.2 to 1.6 is preferably used as the filling layer 17. For instance, Fluorinert that is inert liquid containing fluoride (n=1.30 to 1.39) is preferably used. Alternatively, polytetrafluoroethylene (n=1.36), polymethyl methacrylate (PMMA, n=1.49), or a film made from polymer containing fluoride (n=1.35 to 1.43) may be used.

The material for the filling layer 17 is not limited to the foregoing material. Another material that has a refractive index that is almost the same as or that is intermediate between those the low refractive index layer 16 and the opposite substrate 18 can be used. The lower limit of the refractive index can be approximately 1.2 or less since an effect of providing the filling layer 17 can be achieved when the refractive index is larger than air (n=1).

The filling layer 17 can be formed by injecting liquid under a vacuum after sealing a light-emitting element with the opposite substrate 18. Alternatively, the filling layer 17 can be manufactured by a droplet discharging method, a dropping method, a printing method, a coating method, or the like as typified by an ink jetting method.

The opposite substrate 18 is not limited to a glass substrate. A quartz substrate, various plastic substrates explained in Embodiment 1, or the like can be used as the opposite substrate 18. The opposite substrate 18 may be the same kind of a substrate 10. The other structure of the light-emitting element according to this embodiment can be referred to Embodiment 1.

Because the space between the low refractive index layer 16 and the opposite substrate 18 is filled with the filling layer 17 in the light-emitting element according to the present invention, difference in refractive indexes of an interface between the low refractive index layer 16 and the filling layer 17, and an interface between the filling layer 17 and the opposite substrate 18 can be reduced. Accordingly, light extraction efficiency can be further improved.

A light-emitting element according to the present invention can be adopted in a light-emitting device as typified by an EL display. The light-emitting device can be broadly divided into two kinds, that is, a simple matrix system in which an electroluminescent layer is formed between two kinds of stripe-shaped electrodes provided so as to be right angles with each other, and an active matrix system in which an electroluminescent layer is formed between a pixel electrode and an opposite electrode arranged in a matrix configuration and connected to TFT. The light-emitting element according to the present invention can be applied to either of the simple matrix system and the active matrix system.

Embodiment 4

Figure 3A:
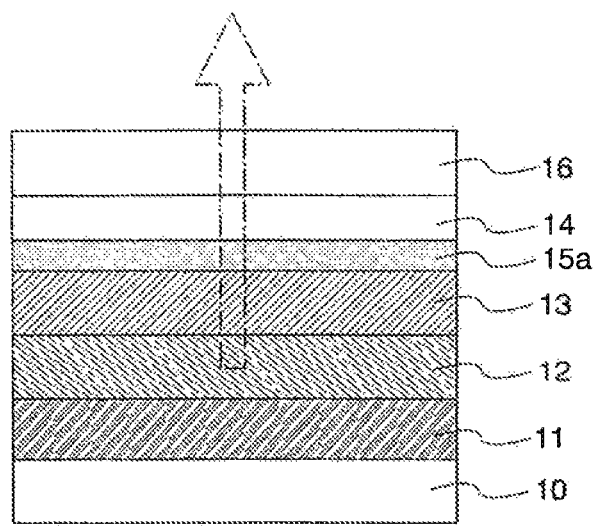
FIGS. 3A and 3B are explanatory views for showing a structure of a light-emitting element according to the present invention (in which a stress relieving layer is provided at the bottom of a passivation film)

In this embodiment, the case of providing a stress relieving layer to a bottom (pixel electrode side) of a passivation film is explained with reference to FIGS. 3A and 3B. In the foregoing embodiment, the stress relieving layer is provided over the passivation film. Alternatively, peeling or cracking can be effectively prevented by forming a stress relieving layer 15a at the bottom of a passivation film 14 (FIG. 3A). By providing the stress relieving layer 15a, the thickness of the passivation film 14 can be increased without being adversely affected by peeling or cracking of the passivation film 14. As a result, extreme high blocking effects can be obtained. The stress relieving layer 15a may have a lamination layer structure.

As the stress relieving layer 15a, an organic material or inorganic material having small stress may be appropriately used. For instance, SiNO is preferably used as the stress relieving layer. Alternatively, SiO or SiON can be used. Further alternatively, aromatic amines that is categorized as a so-called hole transporting or injecting material in an EL element such as α-NPD (that may be referred to as simply NPD), NPD (4,4'-bis-[N-(naphtyl)-N-phenyl-amino]biphenyl) or TPD. In this embodiment, the refractive index of the stress relieving layer 15a is not especially limited, and so a material for the stress relieving layer can be freely selected.

Figure 3B:
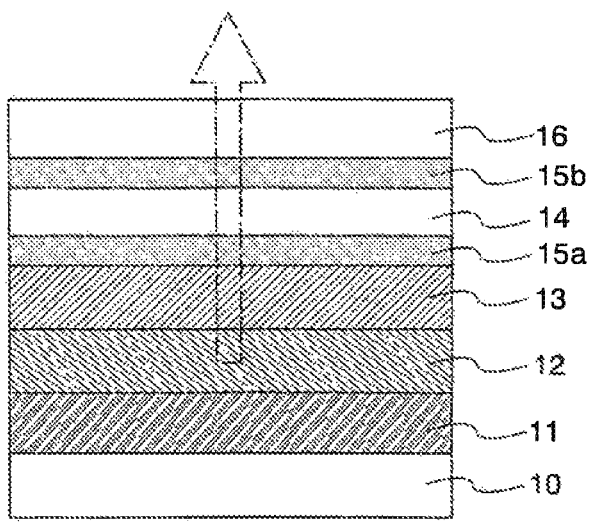

As illustrated in FIG. 3B, the stress relieving layer 15a (first stress relieving layer) and the stress relieving layer 15b (second stress relieving layer) can be provided so as to interpose the passivation film 14 therebetween. Here, the stress relieving layer 15b having the condition described in Embodiment 1 may be used. On the other hand, the stress relieving layer 15a is not especially limited. The foregoing material may be selected to be used as the stress relieving layer 15a. The materials for the stress relieving layers 15a and 15b may be the same or different.

In the case that the passivation film 14 is interposed between the stress relieving layers, light extraction efficiency can be improved while preventing peeling or cracking of the passivation film 14.

EXAMPLE 1

Figure 4A:
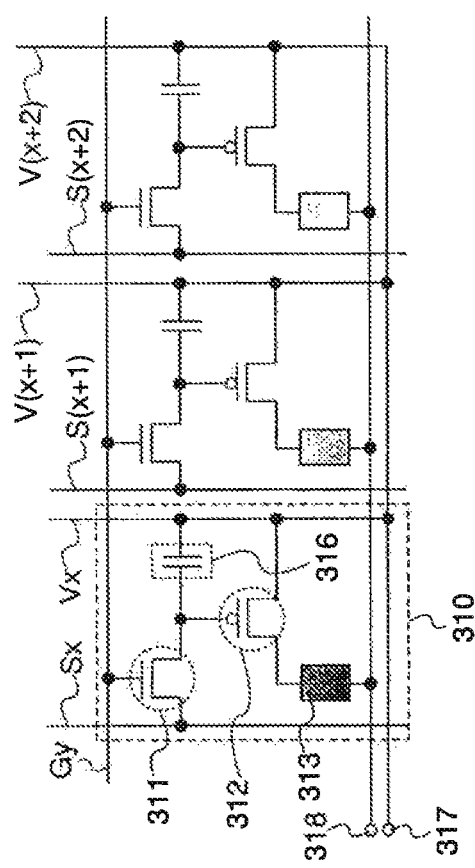
FIGS. 4A and 4B are equivalent circuit diagrams of a pixel region of a display device according to the present invention and a top view of a display panel of the display device, respectively.

In this example, the structure of an active matrix display device (also referred to as an active matrix light-emitting device) using a light-emitting element according to Embodiments 1 to 3 is explained with reference to FIGS. 4 and 5. A display device according to this example has a plurality of pixels 310 including a plurality of elements in a region formed by the intersection of a source line Sx (x is a natural number, 1≤x≤m) with a gate line Gy (y is a natural number, 1≤x≤n) via an insulator (FIG. 4A). The pixel 310 has two transistors of a light-emitting element 313 and a capacitor element 316. Among the two transistors, one is a transistor for switching 311 that controls input of a video signal, and the other is a transistor for driving 312 that controls ON/OFF of light of the light-emitting element 313. The capacitor element 316 serves to hold gate-source voltage of the transistor 312.

A gate electrode of the transistor 311 is connected to the gate line Gy. One of a source electrode and a drain electrode is connected to the source line Sx, and the other is connected to a gate electrode of the transistor 312. One of a source electrode and a drain electrode of the transistor 312 is connected to a first power source 317 via a power source line Vx (x is a natural number, 1≤x≤l), and the other is connected to a pixel electrode of the light-emitting element 313. An opposite electrode (transparent electrode 13) is connected to a second power source 318. The capacitor element 316 is provided between the gate electrode and the source electrode of the transistor 312. The transistors 311 and 312 may have either conductivity of n-type or p-type. FIG. 4 illustrates the structure in which the transistor 311 is an n-type and the transistor 312 is a p-type. The electric potential of the first power source 317 and the second power source 318 is not especially restricted. The first power source 317 and the second power source 318 are provided different electric potential from each other so that forward bias voltage or reverse bias voltage is applied to the light-emitting element 313.

A semiconductor constituting the transistors 311 and 312 may be an amorphous semiconductor (amorphous silicon), a microcrystalline semiconductor, a crystalline semiconductor, an organic semiconductor, or the like. The microcrystalline semiconductor may be formed by using silane gas (SiH$_4$) and fluorine gas (F$_2$), or silane gas (SiH$_4$) and hydrogen gas. Alternatively, the microcrystalline semiconductor may be formed by forming a thin film by using the foregoing gas and emitting laser light to the thin film. The gate electrodes of the transistors 311 and 312 are formed by a single layer or a laminated layer by a conductive material. For instance, the laminated layer is preferably formed to have any one of the following structures; a lamination layer structure formed by stacking tungsten (W) over tungsten nitride (WN), a lamination layer structure formed by stacking aluminum (Al) and molybdenum (Mo) over molybdenum (Mo), and a lamination layer structure formed by stacking molybdenum (Mo) over molybdenum nitride (MoN).

Figure 4B:
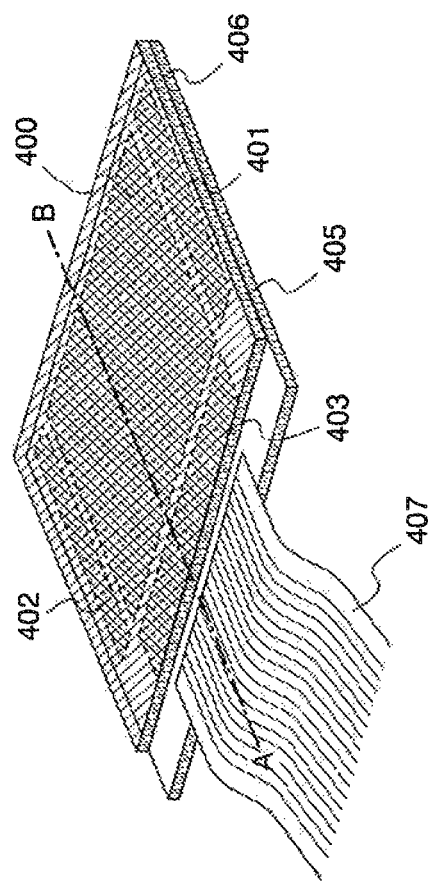

FIG. 4B is a top view of a display panel of a display device according to this example. In FIG. 4B, a display region 400 having a plurality of pixels (pixels 310 illustrated in FIG. 4A) including light-emitting elements, gate drivers 401 and 402, a source driver 403, and a connecting film 407 such as an FPC are formed over a substrate 405 (FIG. 4B). The connecting film 407 is connected to an IC film or the like.

FIGS. 5A and 5B are cross-sectional views of a display panel illustrated in FIG. 4B taken along line A-B. FIG. 5A illustrates a top emission display panel, whereas FIG. 5B illustrates a dual emission display panel.

FIGS. 5A and 5B illustrate the transistor 312 (the transistor 311 in FIG. 4A is omitted) provided to the display region 400, the light-emitting element 313, and an element group 410 provided to the source driver 403. Reference numeral 316 denotes a capacitor element. A sealing agent 408 is provided around the periphery of the display region 400, the gate drivers 401 and 402, and the source driver 403. Accordingly, the light-emitting element 313 is sealed with the sealing agent 408 and an opposite substrate 406. The sealing process is the process for protecting the light-emitting element 313 against moisture, in which case a cover material (glass, ceramic, plastic, metal, and the like) is used for the sealing process. Alternatively, thermosetting resin or ultraviolet curing resin can be used for the sealing process, further alternatively, a thin film having high barrier property such as a metal oxide or nitride can be used. A material that has low refractive index with respect to air or a filing layer 17 described in Embodiment 3 in order to improve light extraction efficiency.

As the sealing agent 408, ultraviolet curing or thermosetting epoxy resin may be used. Ultraviolet epoxy resin (2500 Clear manufactured by Electrolite Cooporation) having high resistance, a refractive index of 1.50, viscosity of 500 cps, shore D hardness of 90, tensile intensity of 3000 psi, Tg point of 150° C., volume resistance of 1×10$^{15}$ Ω·cm, resistance voltage 450 V/mil.

In the light-emitting element 313, the transparent electrode 13 is connected to the second power source 318 in FIG. 4A. An element formed over the substrate 405 is preferably made from a crystalline semiconductor (polysilicon) having better characteristics such as mobility than that of an amorphous semiconductor. In this instance, it can be realized that the surface of the panel becomes monolithic. A panel having the foregoing structure can be reduced its size, weight, and thickness since the number of external ICs to be connected is reduced.

The display region 400 can be composed of a transistor having an amorphous semiconductor (amorphous silicon) formed over an insulating surface as a channel portion. The gate drivers 401 and 402, and the source driver 403 can be composed of IC chips. The IC chips can be pasted onto the substrate 405 by a COG method or pasted onto the connecting film 407 for connecting to the substrate 405. The amorphous semiconductor can be readily formed over a large substrate by using a plasma CVD method. Further, a panel can be provided at low cost since a process of crystallization is not required. When a conductive layer is formed by a droplet discharging method as typified by an ink jetting method, the panel can be provided at further low cost.

FIG. 5A is explained in detail. In the structure illustrated in FIG. 5A, first, second, and third interlayer insulating films 411, 412, and 413 are formed over the transistor 312 and the element group 410. Further, a wiring 414 is formed via an opening portion that is provided in the first and second interlayer insulating films 411 and 412. The wiring 414 serves as a source wiring or a drain wiring of the transistor 312 and the element group 410, a capacitor wiring of the capacitor element 316, or the like. As the wiring 414, alloys containing aluminum and nickel are desirably used. The alloys can contain carbon, cobalt, iron, silicon, and the like. The rate of content of the foregoing materials in the alloys are preferably from 0.1 to 3.0 atomic % of carbon; from 0.5 to 7.0 atomic % of at least one element of nickel, cobalt, iron; and from 0.5 to 2.0 atomic % of silicon. These materials have the characteristic of having a low resistance value.

In the case that Al is used as the wiring 414, there is a problem of generating corrosion of a pixel electrode 11, for example, ITO. Despite of the problem, the wiring 414 can make good contact to ITO by forming a lamination layer structure of interposing the Al (or Al—Si alloy) between Ti or TiN. For example, a lamination layer structure of stacking sequentially Ti, Al, and Ti over a substrate may be adopted. On the other hand, the foregoing Al—Si alloy, Al—C—Ni alloy, or the like has oxidation-reduction potential that is about equal to that of a transparent conductive film such as ITO, and so the Al—Si alloy or the Al—C—Ni alloy can make direct contact to IO or the like without having a lamination layer structure (that is, being interposed between Ti, TiN, and the like). The wiring 414 can be formed by using a target formed by the foregoing alloys by a sputtering method. In the case that etching is performed by using resist as a mask, a wet etching method is preferably used, in which case phosphoric acid or the like can be used as etchant. The wiring connected to the second power source 318 can be formed in the same manner as that of the wiring 414.

The pixel electrode 11 is formed via an opening portion provided to the third interlayer insulating film 413. A reflective conductive film is used as the pixel electrode 11 since the panel illustrated in FIG. 5A is a top emission panel.

The materials of the first to third interlayer insulating films are not especially restricted. For instance, the first interlayer insulating film may be made from an inorganic material, and the second and third interlayer insulating films may be made from organic materials, in which case a film including carbon such as silicon oxide, silicon nitride, silicon oxynitride, DLC, or carbon nitride; PSG (phosphorus glass); BPSG (boron phosphorus glass); an alumina film; or the like can be used as the inorganic material. As a method for forming, a plasma CVD method, a low pressure CVD (LPCVD) method, an atmospheric plasma method, or the like can be used. Alternatively, an SOG film (for example, an SiOx film including an alkyl group) formed by a coating method can be used.

As the organic material, a photosensitive or non photosensitive organic material such as polyimide, acrylic, polyamide, resist, or benzocyclobotene; or heat-resisting organic resin such as siloxane can be used. As a method for forming the interlayer insulating films, a spin coating method, a dipping method, a spray coating method, droplet discharging method (ink jetting method, screen printing method, offset printing method), a doctor knife, a roll coater, a curtain coater, knife coater, or the like can be used. The first to third interlayer insulating films can be formed by stacking the foregoing materials.

A bank layer 409 (also referred to as bank) is formed around the periphery of the pixel electrode 11. As the bank layer 409, a photosensitive or non photosensitive organic material such as polyimide, acrylic, polyamide, resist, or benzocyclobutene; or heat-resisting organic resin such as siloxane; an inorganic insulating material (SiN, SiO, SiON, SiNO, or the like); or a lamination layer formed by the foregoing materials can be used. In this instance, photosensitive organic resin covered by a silicon nitride film is used. As the foregoing insulator, either a negative type photosensitive resin that becomes insoluble to etchant by light or a positive type photosensitive resin that becomes dissoluble to etchant by light can be used.

The shape of a side of the bank layer 409 is not especially restricted. The bank layer 409 has preferably an S shape as illustrated in FIGS. 5A and 5B or the like. In other word, the bank layer 409 has preferably an infection point at the side face of the bank layer 409. Accordingly, the coverage of an electroluminescent layer 12, a transparent electrode 13, and the like can be improved. The present invention is not limited to the foregoing shape; the insulator may be formed to have a curved upper edge portion having a radius of curvature.

In such a way of Embodiments 1 to 3, the electroluminescent layer 12, the transparent electrode 13, a passivation film 14, a stress relieving film 15, a low refractive index layer 16, and the like are formed over the pixel electrode 11. The illustrated structure utilizes, but not exclusively, Embodiment 1. For example, the filling layer 17 described in Embodiment 3 may be provided in space 415. The upper layers over the passivation film 14 are, but not exclusively, formed over the whole surface of the substrate.

Since the third interlayer insulating film 413 is formed over the second interlayer insulating film 412 and the pixel electrode 11 is formed thereover in the structure illustrated in FIG. 5A, the design freedom of the structure is increased without being a region provided with the light-emitting element 313 limited by a region provided with the transistor 312 and the wiring 414. Accordingly, a display device having a desired opening ratio can be obtained.

FIG. 5B is further explained in detail. In the structure illustrated in FIG. 5B, the first interlayer insulating film 411 and the second interlayer insulating film 412 are formed over the transistor 312 and the element group 410. The wiring 414 is formed via an opening portion provided to the first interlayer insulating film 411 and the second interlayer insulating film 412. The wiring 414 serves as a source wiring or a drain wiring of the transistor 312 and the element group 410, a capacitor wiring of the capacitor element 316, or the like. The transistor 312 is connected to the pixel electrode 14 via at least one wiring 141. FIG. 5B illustrates a dual emission type, and so a transparent conductive film is used as the pixel electrode 11. In the illustrated structure, the pixel electrode 11 is formed after forming the wiring 414. However, the structure may be formed reversely. Alternatively, the wiring 414 and the pixel electrode 11 can be formed by one layer.

In this example, the first interlayer insulating film 411 formed over the transistor 312 has a barrier property for preventing impurities such as Na, $O_2$, or moisture from penetrating into the transistor 312 (the first interlayer insulating film may be referred to as a cap insulating film by having the foregoing property), and so the first interlayer insulating film is preferably formed as much as possible. Alternatively, the first interlayer insulating film can be omitted.

The bank layer 409 (also referred to as a bank) is formed around the periphery of the pixel electrode 11. In such a way of Embodiments 1 to 3, the electroluminescent layer 12, the transparent electrode 13, the passivation film 14, the stress relieving film 15, the low refractive index layer 16, and the like are formed over the pixel electrode 11. The illustrated structure utilizes, but not exclusively, Embodiment 1. For example, the filling layer 17 described in Embodiment 13 may be provided in space 415.

The light-emitting element according to the present invention is a top emission type (or a dual emission type) which emits light passing through the transparent electrode 13. For example, in the case that the transparent electrode 13 serves as a cathode, an aluminum film having a thickness of 1 to 10 nm or an aluminum film containing slightly Li may be used for the transparent electrode 13. When using an aluminum film as the transparent electrode 13, a material being contact with the electroluminescent layer 12 can be formed by a material except an oxide, and so the reliability of a light-emitting device can be improved. Before forming the aluminum film having a thickness of 1 to 10 nm, a layer having a light-transmitting property (thickness of 1 to 5 nm) made from $CaF_2$, $MgF_2$, or $BaF_2$ may be formed as a cathode buffer layer. In order to reduce the resistance of the cathode, the transparent electrode 13 may be formed to have a lamination layer structure composed of a thin metal film having a thickness of 1 to 10 nm and a transparent conductive film (ITO, indium oxide-zinc oxide alloy ($In_2O_3$—ZnO), zinc oxide (ZnO), or the like). Alternatively, in order to reduce the resistance of the cathode, an auxiliary electrode may be provided over the transparent electrode 13 in a region that is not to be an emission region. The cathode may be formed selectively by using a resistance heating method by vapor deposition with an evaporation mask.

A material and a structure of the first and second interlayer insulating films, the wiring 414, the bank layer 409, and the like can be referred to the invention according to FIG. 5A.

In FIG. 5B, the pixel electrode 11 extends to a region provided with the capacitor element 404, and serves as a capacitor electrode of the capacitor element 404. The position of the connecting film 407 is over the second interlayer insulating film 412, which is different from that in FIG. 5A. The connecting film 407 and the element group 410 are connected to each other via the wiring 414. Therefore, a dual emission display device can be obtained.

Each characterizing portion in the invention related to FIGS. 5A and 5B can be implemented by replacing or combining with each other. The present invention can be freely combined with Embodiments and the other Examples.

EXAMPLE 2

In this example, another structure of an active matrix display device according to Example 1 is explained with reference to FIGS. 6A and 6B. In a display device according to this example, color filters are provided in each pixel portion, and at least one layer or a part of the layer among the second and third interlayer insulating films and the bank layer 409 in Example 1 is doped with carbon or metal particles having a light-shielding property. Hereinafter, a detail description will be given.

A top emission display device has color filters 90 to 92 of R, G, and B over an opposing substrate 406. The color filters 90 to 92 can be made from a known material by a known method. As a material for an electroluminescent layer, a material that can exhibit white emission is basically used. As the second interlayer insulating film and the bank layer, an interlayer insulating film 417 and a bank layer 416 having a light-shielding property formed by doping carbon or metal particles to an organic material such as acrylic, polyimide, or siloxane are used, respectively. On the other hand, the third interlayer insulating film 413 is formed by using transparent organic resin such as acrylic, polyamide, or siloxane.

The interlayer insulating film 417 having a light-shielding property and the bank layer 409 having a light-shielding property are formed in such a way that carbon and metal particles having a light-shielding property are doped to an organic material such as acrylic, polyimide, or siloxane, and the material is agitated by using a shaker or an ultrasonic shaker, then, the agitated material is filtrated according to need, and then, the foregoing interlayer insulating film 417 and bank layer 409 are formed by a spin coating. When doping carbon particles or metal particles to an organic material, a surface active agent, a dispersing agent, or the like may be doped to the organic material in order that these particles are mixed thereinto uniformly. In the case that the carbon particles are doped, the amount of doping the carbon particles may be controlled so that the density of the carbon particles is 5 to 15% by weight. Further, the thin film formed by a spin coating without modification can be used as the interlayer insulating film 417 and bank layer 409. Alternatively, the thin film can be baked to be hardened. The transmittance of the deposited thin film is 0% or almost 0%. The reflectance of the deposited thin film is 0% or almost 0%.

The interlayer insulating film 417 having a light-shielding property of the bank layer 416 having a light-shielding property may include partly a transparent insulating layer. On the other hand, the third interlayer insulating film may include partly an insulating layer having a light-shielding property. In such a way of Embodiments 1 to 3, an electroluminescent layer 12, a transparent electrode 13, a passivation film 14, a stress relieving film 15, a low refractive index layer 16, and the like are formed over a pixel electrode 11. The illustrated structure utilizes, but not exclusively, Embodiment 1. For example, the filling layer 17 described in Embodiment 3 may be provided in space 415. A material and a structure of the first interlayer insulating film 411 and the wiring 414 can be referred to Example 1.

A top emission display device illustrated in FIG. 6A can prevent boundaries between pixels from blurring due to the influence of unnecessary light (including light generated by being reflected by a bottom surface) emitted from a light-emitting layer by virtue of having the interlayer insulating film 417 having a light-shielding property and the bank layer 416 having a light-shielding property. That is, boundaries between pixels become clear since the foregoing insulating film having a light-shielding property absorbs the unnecessary light, and so a high-resolution image can be displayed. Since the influence of unnecessary light can be prevented by a light-shielding film, a polarizing plate is made redundant, and the display device can be reduced its size, weight, and thickness. Further, unnecessary light can be prevented from leaking into a transistor formation region of a pixel, and so active matrix driving can be possible by a transistor with high reliability.

In a dual emission display device illustrated in FIG. 6B, a transistor 312 and a first interlayer insulating film 411 are formed over a substrate 405, moreover, a first interlayer insulating film 417 having a light-shielding property is formed over the substrate 405. Opening portions for passing light generated in the light-emitting layer are provided to the first interlayer insulating film 417 having a light-shielding property, and resin having a light-transmitting property and including pigment of R, Q, and B is filled to the opening portions. Accordingly, color filters 93 to 95 are formed. The resin including the pigment is preferably formed by a droplet discharging method selectively. Moreover, an opposite substrate 406 is provided with color filters 90 to 92 of R, Q and B as is the case with FIG. 6A. The color filters 90 to 92 can be formed by a known material and a known method.

As a part of the second interlayer insulating film or the bank layer, the interlayer insulating film 417 having a light-shielding property and the bank layer 416 having a light-shielding property formed by doping carbon or metal particles to an organic material such as acrylic, polyimide, or siloxane are used. A part of the other portion of the bank layer 406 is formed by a transparent organic material such as acrylic, polyimide, or siloxane. The interlayer insulating film 417 having a light-shielding property may include partly a transparent insulating layer.

The interlayer insulating film 417 having a light-shielding property and the bank layer 416 having a light-shielding property are formed in such a way that carbon and metal particles having a light-shielding property are doped to an organic material such as acrylic, polyimide, or siloxane, and the material is agitated by using a shaker or an ultrasonic shaker, then, the agitated material is filtrated according to need to be spin-coated into the foregoing interlayer insulating film 417 and bank layer 409. When doping carbon particles or metal particles to an organic material, a surface active agent, a dispersing agent, or the like may be doped to the organic material in order that these particles are mixed thereinto uniformly. In the case that the carbon particles are doped, the amount of doping the carbon particles may be controlled so that the density of the carbon particles is 5 to 15% by weight. Further, the thin film formed by a spin coating without modification can be used as the interlayer insulating film 417 and bank layer 409. Alternatively, the thin film can be baked to be hardened. The transmittance of the deposited thin film is 0% or almost 0%. The reflectance of the deposited thin film is 0% or almost 0%.

In such a way of Embodiments 1 to 3, the electroluminescent layer 12, the transparent electrode 13, the passivation film 14, the stress relieving film 15, the low refractive index layer 16, and the like are formed over the pixel electrode 11. The illustrated structure utilizes, but not exclusively, Embodiment 1. For example, the filling layer 17 described in Embodiment 3 may be provided in space 415. A material and a structure of the first interlayer insulating film 411 and the wiring 414 can be referred to Example 1.

A dual emission display device illustrated in FIG. 6B can prevent boundaries between pixels from blurring due to the influence of unnecessary light (including light generated by being reflected by a bottom surface) emitted from a light-emitting layer by virtue of having the interlayer insulating film 417 having a light-shielding property and the bank layer 416 having a light-shielding property. That is, boundaries between pixels become clear since the foregoing insulating film having a light-shielding property absorbs the unnecessary light, and so a high-resolution image can be displayed. Since the influence of unnecessary light can be prevented by a light-shielding film, a polarizing plate is made redundant, and the display device can be reduced its size, weight, and thickness. Further, unnecessary light can be prevented from leaking into a transistor formation region of a pixel, and so active matrix driving can be possible by a transistor with high reliability.

In the case of forming a color filter, a black matrix (a lattice-shaped or stripe light-shielding film for separating each pixel of R, G, and B optically) is generally provided. However, the interlayer insulating film 417 having a light-shielding property and the bank layer 416 having a light-shielding property are formed corresponding to a region that should be provided with the black matrix in the invention according to the structure illustrated in FIGS. 6A and 6B. Therefore, manufacturing yields are improved since alignment can be readily carried out, and the cost can be reduced since an extra process is not required to be added.

In this example, the display panel can exert the foregoing effect such as preventing adverse affects due to unnecessary light generated in a light-emitting layer in the case that at least either of the interlayer insulating film 417 having a light-shielding property and the bank layer 416 having a light-shielding property is formed. Needless to way, both of the foregoing layers are preferably formed. Each characterizing portion in the invention related to FIGS. 6A and 6B can be implemented by replacing or combining with each other. The present invention can be freely combined with Embodiments and the other Examples.

EXAMPLE 3

An example of a structure of a light-emitting element according to Embodiments is explained in this example. As a sample for reference, an EL element for reference is manufactured to have a laminated layer structure by stacking sequentially over a substrate an anode ITO (110 nm), α-NPD (40 nm), Alq$_3$: DMQd (quinacridone derivative) (37.5 nm), Alq$_3$ (20 nm), BzOS: Li (20 nm), and a cathode ITO (110 nm). Moreover, an EL element is manufactured by forming layers listed in Table 1 (the EL element has the structure in which a passivation film is interposed between stress relieving layers in this example) over the cathode ITO to measure luminance of light emitted to the top direction at applied current having current density of 2.5 mA/cm$^2$. Luminance (105.8 cd/m$^2$) of the reference EL element measured at applied current having current density of 2.5 mA/cm$^2$ is compared to that of the foregoing EL element. As a result, the luminance listed in Table 1 is increased than that of the reference EL element.

dark spots are not observed therein. Needless to say, peeling or crack of the SiN layer serving as a passivation film is not occurred because of the stress relieving film.

In another embodiment or example, a stress relieving layer can be newly formed between the transparent electrode 13 and the passivation film. A material for the stress relieving layer may be the same or different of the stress relieving material formed over the passivation film.

EXAMPLE 4

In this example, an example of method for manufacturing a passivation film 14 and a stress relieving layer 15 according to the present invention is explained. Firstly, the passivation film 14 can be formed by a single layer or a lamination layer of a silicon nitride film, a silicon oxide film, silicon oxynitride film, a DLC film, a CN film by a sputtering method or a CVD method. Especially, the passivation film 14 is preferably formed by a silicon nitride film deposited by a radio-frequency sputtering method using a silicon target. A fine silicon nitride film obtained by the RF sputtering method using a silicon target can prevent an active element such as a TFT (thin film transistor) from being contaminated by alkali metal such as natrium, lithium, or magnesium or alkali earth metal to prevent effectively the variation of a threshold value. In addition, the fine silicon nitride film has an extreme high blocking effect against moisture or oxygen. In order to increase a blocking effect, oxygen and hydrogen contents in the silicon nitride film may be preferably 10 atomic % or less, preferably, 1 atomic % or less.

As a specific sputtering condition, a nitride gas or a mixed gas of nitrogen and rare gas, pressure of 0.1 to 1.5 Pa, frequency of 13 to 40 MHz, electric power of 5 to 20 W/cm$^2$, substrate temperature of room temperature to 350° C., distance between silicon target (1 to 10 Ωcm) and a substrate of 40 to 200 mm, and back pressure of 1×10$^{-3}$ Pa or less. Heated rare gas may be sprayed to the back of a substrate. For example, a fine silicon nitride film has characteristics that it has a slow etching rate (hereinafter, the etching rate refers to a rate of etching at 20° C. by using LAL 500) of 9 nm or less (preferably, 0.5 to 3.5 or less), and low hydrogen density of 1×10$^{21}$ atoms/cm$^{-3}$ or less. The fine silicon nitride film is obtained under the condition, that is, flow ratio of Ar:N$_2$=20 sccm:20 sccm, pressure of 0.8 Pa, frequency of 13.56 MHz, electric power of 16.5 W/cm$^2$, substrate tem-

TABLE 1

| Laminated Structure over Cathode ITO | | | | | Upper Surface-side Luminance at 2.5 mA/cm$^2$ (cd/m$^2$) | Increasing Ratio of Luminance Compared to Reference |
|---|---|---|---|---|---|---|
| 1st Stress Relieving Film | Passivation Film | 2nd Stress Relieving Film | Low Refractive Index Layer | | | |
| SiNO (50 nm) | SiN (150 nm) | SiNO (20 nm) | MgF$_2$ (10 nm) | LiF (10 nm) | 133 | 26% |
| SiNO (50 nm) | SiN (150 nm) | NPD (20 nm) | MgF$_2$ (10 nm) | LiF (10 nm) | 106.7 | 1% |
| NPB (50 nm) | SiN (150 nm) | NPD (20 nm) | MgF$_2$ (10 nm) | LiF (10 nm) | 107 | 1% |

The foregoing measurement results show that SiNO is preferably used as the stress relieving layer among others. The reference EL element has not so good reliability since dark spots are generated therein, whereas the EL element having the lamination layer structure listed in Table 2 has good reliability since dark spots are drastically reduced or perature of 200° C., distance between a silicon target and a substrate of 60 mm, and back pressure of 3×10$^{-5}$ Pa. The LAL500 is high-purity buffered hydrogen fluoride LAL500 SA grade manufactured by STELLA CHEMIFA CORPORATION that is solution of NH$_4$HF$_2$ (7.13%) and NH$_4$F (15.4%).

The foregoing silicon nitride film obtained by a sputtering method has a dielectric constant of 7.02 to 9.3, a refractive index of 1.91 to 2.13, an internal stress of $4.17 \times 10^8$ dyn/cm$^2$, an etching rate of 0.77 to 1.31 nm/min. A positive sign and a minus sign of the internal stress are changed with each other depending on a compression stress and a tensile stress, in which case only an absolute value is mentioned. The foregoing silicon nitride film obtained by a sputtering method has Si density of 37.3 atomic % and N density of 55.9% that are measured by RBS. The foregoing silicon nitride film obtained by a sputtering method has hydrogen density of $4 \times 10^{20}$ atoms/cm$^{-3}$, oxygen density of $8 \times 10^{20}$ atoms/cm$^{-3}$, and carbon density of $1 \times 10^{19}$ atoms/cm$^{-3}$ that are measured by SIMS. The foregoing silicon nitride film obtained by a sputtering method has transmittance of 80% or more in a visible light region.

In each of the foregoing structure, the thin film having carbon as its main component is the DLC film, the CN film, or the amorphous carbon film in a thickness of 3 to 50 m. The DLC film has a SP$^3$ bond as the carbon-carbon bond as short range order; however, the DLC film has an amorphous structure macroscopically. The DLC film is composed of carbon of 70 to 95 atomic % and hydrogen of 5 to 30 atomic %. The DLC film is so hard and provides excellent electrical isolation. In addition, the DLC film is stable chemically and hardly transforms. Further, the DLC film has thermal conductivity of 200 to 600 W/m·K and a refractive index of 2.3 to 23, and can release heat generated in driving. Such the DLC film has a characteristic of having low permeability of gas such as water vapor or oxygen. It is known that the DLC film has hardness of 15 to 25 GPa measured by micro hardness tester.

The DLC film can be formed by a plasma CVD method (typically, an RF plasma CVD method, a microwave CVD method, an electron cyclotron resonance (ECR) CVD method, a thermal filament method CVD method), a combustion method, a sputtering method, an ion beam vapor deposition method, a laser vapor deposition method, or the like. The DLC film can be formed with good adhesiveness with any method. The DLC film is formed by setting a substrate to a cathode. Alternatively, a hard film can be formed by applying negative bias to utilize ion bombardment to some extent. As a reaction gas used for depositing the DLC film, a hydrogen gas and a gas made from carbon hydride (for example, $CH_4$, $C_2H_2$, or $C_6H_6$) are used. The gas is ionized by glow discharge to yield accelerated collision of ions against the cathode applied with negative self bias. Accordingly, a fine and smooth DLC film can be obtained. Further, the DLC film is transparent or semitransparent to visible light. As used herein, the term "transparent to visible light" refers to transmittance of visible light of 80 to 100%, whereas the term "semitransparent to visible light" refers to transmittance of visible light of 50 to 80%.

As a reaction gas used for depositing the CN film, a nitrogen gas and a gas made from carbon hydride (for example, $C_2H_2$ or $C_2H_4$) may be used.

Then, a stress relieving layer 15 is explained. The stress relieving layer is formed by an alloy film such as MgO, SrO$_2$, SiO, or CaN; or a material film including an organic compound such as α-NPD (4,4'-bis-[N-(naphtyl)-N-phenyl-amino]biphenyl), BCP (bathocuproin), MTDATA (4,4',4"-tris(N-3-methylphenyl-N-phenyl-amino)triphenylamine), Alq$_3$ (tris-8-quinolinolatoaluminum complex). As noted above, the stress relieving film can be formed by the same material as that of at least one layer among a plurality of layers that constitutes a layer containing an organic compound (electroluminescent layer) interposed between an anode and a cathode. The stress relieving layer may be a high molecular material film containing an organic compound obtained by a coating method (an ink jetting method or a spin coating method). For example, the foregoing material is preferably used for the stress relieving film not only for its low film stress and its transparency, but for its hygroscopicity.

EXAMPLE 5

Another structure of an active matrix display device according to Example 1 is explained with reference to FIGS. 7A and 7B. An active matrix display device illustrated in FIG. 7A comprises a low refractive index layer 418 formed over both faces or at least one face of an opposite substrate 406. As the low refractive index layer 418, lithium fluoride (LIP, n=1.30 to 1.39), magnesium fluoride (MgF$_2$=1.38 to 1.40), barium fluoride (BaF$_2$, n=1.47), or the like having a refractive index that is higher than that of air and lower than that of the opposite substrate 406, typically, a glass substrate. Further, in the case that the low refractive index layer 418 is formed over both faces of an opposite substrate 406, the materials for the low refractive index layer 418 over both faces may be the same or different.

An opposite substrate that is formed by depositing LiF over both surfaces of a glass substrate to have a thickness of 30 nm as the low refractive index layer 418 is used to manufacture an EL element of 1×1. Measurement of the luminance of the EL element at current density of 2.5 mA/cm$^2$ can show approximately 3% of increased luminance despite of the thickness of a cathode (transparent electrode 13).

Each transmittance of the following opposite substrates is measured, that is, 1) an opposite substrate formed by glass, 2) an opposite substrate formed by stacking glass over a low refractive index layer, 3) an opposite substrate formed by stacking a low refractive index layer over glass, and 4) an opposite substrate formed by stacking glass and a low refractive index layer over a low refractive index layer. This measurement yields that transmittance is improved in the number order, that is, luminance is increased in the number order.

An active matrix display device illustrated in FIG. 7B comprises a low refractive index layer 418 formed over both faces or at least one face of an opposite substrate 406, and a filling layer 417 formed between a low refractive index layer 16 at the side of a light-emitting element and the low refractive index layer formed over the opposite substrate 406. As a material for the low refractive index layer, the same material used in FIG. 7A can be used. The filling layer 17 has preferably a refractive index that is almost the same as that of refractive indexes of the low refractive index layer 16 and the low refractive index layer 418 or that is intermediate between those of the low refractive index layer 16 and the low refractive index layer 418. For example, a film made from Fluorinert that is inert liquid containing fluorine (n=1.23 to 1.31) is preferably used. Alternatively, polytetrafluoroethylene (n=1.36), polymethacrylic acid methyl (PMMA, n=1.49), polymer containing fluorine (n=1.35 to 1.43) can be used.

It is not limited to the foregoing material. Another material that has a refractive index that is almost the same value as those or an intermediate value of those of both the low refractive index layers can be used. The lower limit of the refractive index may be approximately 1.2 or less since an effect of providing the filling layer 17 can be achieved when the refractive index is larger than air (n=1). The filling layer 17 can be formed by injecting liquid in vacuum after sealing a light-emitting element with the opposite substrate 406. Alternatively, the filling layer 17 can be formed by a droplet discharging method, a dropping method, a printing method, a coating method as typified by an ink jetting method.

An active matrix type display device is explained in this example; however, a display device that has technical features of the invention according to Examples 1 to 3 and has a structure in which a low refractive layer is provided to an opposite substrate can be also applied to a passive matrix display device. Another constitution of the present invention illustrated in FIG. 7 is according to another embodiment or example. This example can be freely combined with the foregoing embodiment or another example.

EXAMPLE 6

Figure 8A:
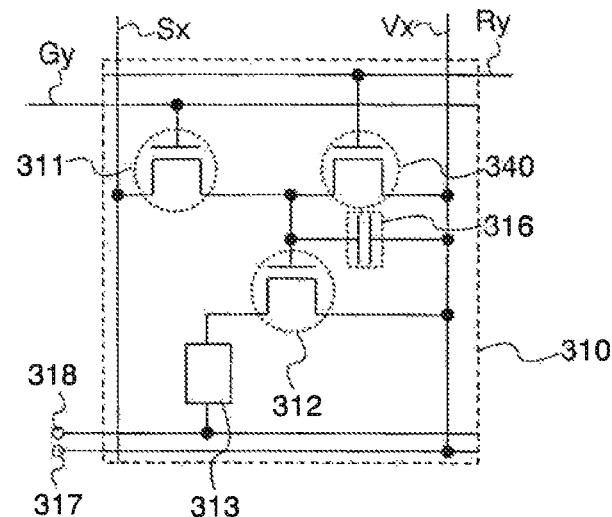
FIGS. 8A and 8B are equivalent circuit diagrams of a pixel region of a display device according to the present invention.

In this example, an example of a pixel circuit that can be applied to the present invention except the pixel circuit illustrated in FIG. 4A is explained with reference to FIGS. 8A and 8B. FIG. 8A illustrates a pixel circuit having a structure in which a transistor 340 for erasing and a gate wiring Ry for erasing are newly provided in a pixel 310 illustrated in FIG. 4A. Since the pixel circuit can make forcibly a light-emitting element 313 have the state of not being applied with current by the arrangement of the transistor 340, a lightning period can be started simultaneously with or immediately after starting a write period without waiting write of signals into all of pixels 310. Therefore, a duty ratio is improved, and a moving image can be especially displayed well.

Figure 8B:
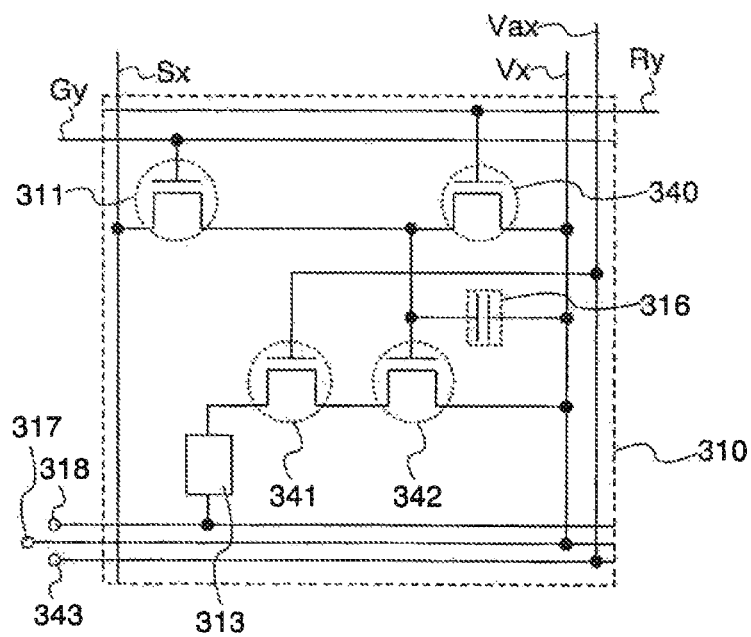

FIG. 8B illustrates a pixel circuit in which a transistor 312 of the pixel 310 illustrated in FIG. 4A is omitted and transistors 341, 342, and a power source line Vax (x is a natural number, 1≤x≤1) are newly provided. The power source line Vax is connected to a power source 343. In this structure, potential of a gate electrode of the transistor 341 is fixed and the transistor 341 is operated in a saturation region by connecting the gate electrode of the transistor 341 to the power source line Vax that maintains the potential of the gate electrode constant. Further, the transistor 342 is operated in a linear region and a video signal including information of lightening and non-lightening of a pixel is inputted to the gate electrode of the transistor 342. Since the value of source-drain voltage of the transistor 342 operating in a linear region is small, slight variation of the source-drain voltage of the transistor 342 does not affect the current value of the light-emitting element 313. Therefore, the value of current passing through the light-emitting element 313 is depending on the transistor 341 operating in the saturation region. The present invention having the foregoing constitution can improve luminance variation of the light-emitting element 341 due to characteristic variation of the transistor 341 to improve image quality. This example can be freely combined with the foregoing embodiment and another example.

EXAMPLE 7

In this example, laminated layer structures of a wiring 414 (the wiring 414 includes a second power source 318 through this example) and a pixel electrode 11 in the foregoing example are explained with reference to FIGS. 9A to 9D. Each diagram in FIGS. 9A to 9D illustrates an extracted portion of a light-emitting element of a pixel region. In the FIGS. 9A to 9D, a passivation film, a stress relieving layer, a low refractive index, and the like are not illustrated.

FIG. 9A illustrates that the wiring is formed to have a laminated layer structure of Mo 600 and an alloy 601 containing aluminum and the pixel electrode 11 is formed by ITO 602. As the alloy 601 containing aluminum, aluminum containing carbon, nickel, cobalt, iron, silicon, and the like is preferably used. The rate of content of the carbon is preferably 0.1 to 3.0 atomic %; at least one kind of the nickel, the cobalt, and the iron, 0.5 to 7.0 atomic %; and the silicon, 0.5 to 2.0 atomic %. The material has one characteristic of having low resistance of 3.0 to 5.0 Ωcm. Here, the Mo 600 serves as barrier metal.

In the case that at least one kind of the nickel, the cobalt, and the iron is contained at 0.5% or more in the alloy 600 containing aluminum, the alloy 600 can be close to electrode potential of the ITO 602, and so the alloy can make directly contact to the ITO 602. Further, heat resistance of the alloy 601 containing aluminum is increased. By setting the rate of content of the carbon 0.1% or more, occurrence of hillock can be prevented. There is an advantage that hillock is also prevented by mixing silicon into the alloy 600 or heating the alloy 600 at high temperature.

FIG. 9B illustrates that an alloy 603 containing aluminum is used as a wiring and the ITO 602 is used as a pixel electrode 11. Here, the alloy 603 containing aluminum contains at least nickel. After forming the alloy 603 containing aluminum, nickel contained in the alloy seeps out to react chemically with silicon in a silicon semiconductor layer 608 of an active element (for example, a TFT) for driving the pixel region. Accordingly, nickel silicide 607 is formed. There is an advantage of improving a conjugative property.

FIG. 9C illustrates that an alloy 604 containing aluminum is stacked as a wiring and ITO is stacked as a pixel electrode 11. It can be found by way of experiment that planarization is drastically improved especially in the case that a laminated layer structure of the alloy 604 containing aluminum and the ITO is adopted. For example, the planarization is two times as favorable as that of a laminated layer structure of a wiring formed by stacking TiN over an Al—Si alloy and ITO and a laminated layer structure of a wiring formed by stacking TiN over an Al—Si alloy and ITSO.

FIG. 9D illustrates that alloys 604 and 606 containing aluminum are used as a wiring and a pixel electrode.

Since the alloy containing aluminum can be formed by patterning by a wet etching method, the alloy containing aluminum can be widely used not only as a wiring or a pixel electrode. The alloy containing aluminum has high reflectivity, and so it is preferably used in a top emission display device. In the case of a dual emission display device, the wiring or the pixel electrode is required to be formed into a thin film so as to pass light therethrough. This example can be freely combined with the foregoing embodiment or another example.

EXAMPLE 8

As an electric appliance using a display device including a pixel region having a light-emitting element according to the present invention, a television device (TV, TV receiver), a camera such as a digital camera or a digital video camera, a cellular phone device (cellular phone), a personal digital assistant, a portable game machine, a monitor, a computer, a sound reproduction device such as a car audio, an image reproduction device having a recording medium such as a domestic game machine, and the like can be nominated. Specific examples are explained with reference to FIGS. 10A to 10F.

Figure 10A:
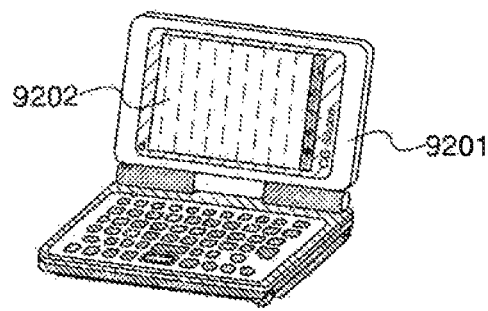
FIGS. 10A to 10F are views for showing electric appliances using display devices according to the present invention.
Figure 10B:
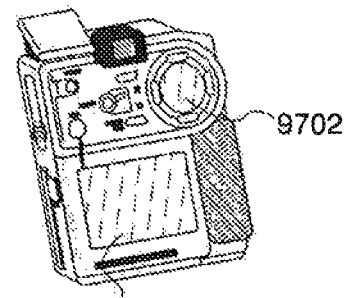
Figure 10C:
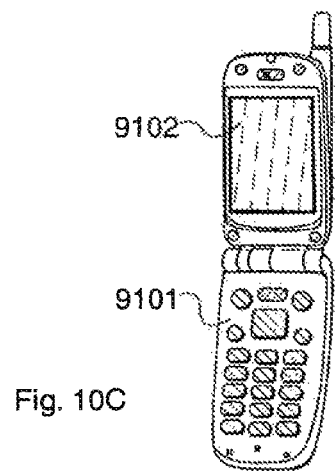
Figure 10D:
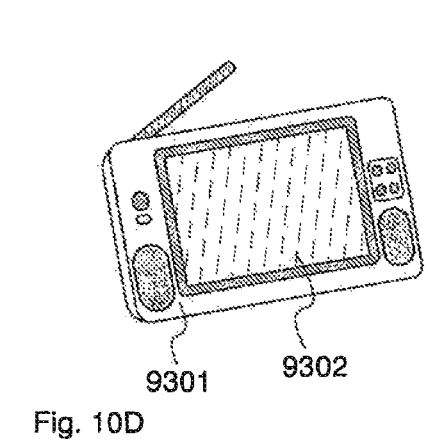
Figure 10E:
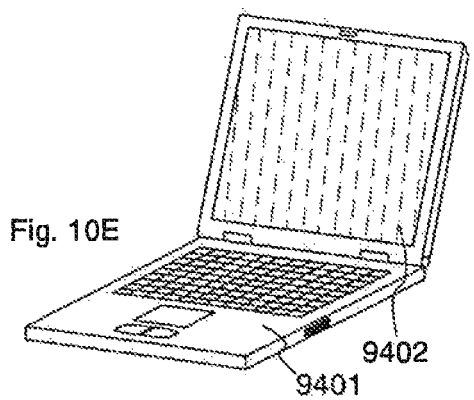

A personal digital assistant using a display device according to the present invention illustrated in FIG. 10A includes a main body 9201, a display device 9202, and the like and can display a high resolution image by the present invention. A digital camera using a display device according to the present invention illustrated in FIG. 10B includes display portions 9701, 9702, and the like and can display a high resolution image by the present invention. A portable terminal using a display device according to the present invention illustrated in FIG. 10C includes a main body 9101, a display portion 9102, and the like and can display a high resolution image by the present invention. A portable television device using a display device according to the present invention illustrated in FIG. 10D includes a main body 9301, a display portion 9302, and the like and can display a high resolution image by the present invention. A laptop personal computer using a display device according to the present invention illustrated in FIG. 10E includes a main body 9401, a display portion 9402, and the like and can display a high resolution image by the present invention. A television device using a display device according to the present invention illustrated in FIG. 10F includes a main body 9501, a display portion 9502, and the like and can display a high resolution image by the present invention. In the case that an interlayer insulating film having a light-shielding property and a bank layer having a light-shielding property are provided, an influence due to unnecessary light can be suppressed, and so a polarizing plate is not required, which yields to reduce the size, the weight, and the thickness.

Figure 11:
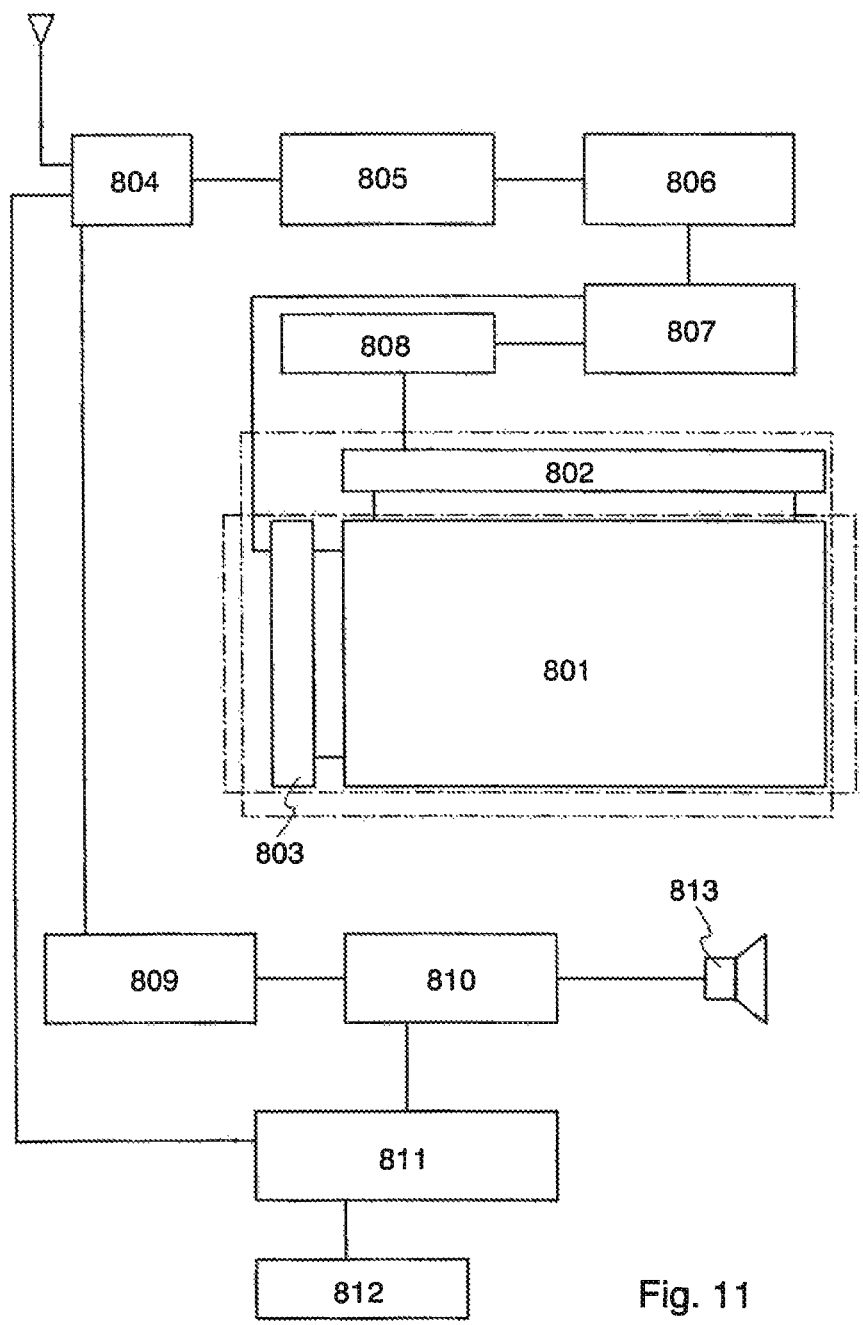
FIG. 11 is a block diagram for showing a main structure of a television set using a display device according to the present invention.

A brief explanation of the main structure of the foregoing television device is given with reference to a block diagram in FIG. 11. In FIG. 11, an EL display panel 801 is manufactured by using a display device according to the present invention. A method for connecting the EL display panel 801 to an external circuit are as follows; that is, 1) a method of forming together a pixel portion of a display panel and a scanning line driver circuit 803 over a substrate and implementing a signal line driver circuit 802 separately as a driver IC, 2) a method of forming only a pixel portion of a display panel, and mounting the scanning driver circuit 803 and the signal line driver circuit 802 thereto by a TAB system, 3) a method of mounting the scanning driver circuit 803 and the signal line driver circuit 802 to the pixel portion of the display panel and the periphery thereof by a COG system. Any form can be adopted.

Another structure of an external circuit at an input side of a video signal comprises a video wave amplifier circuit 805 that amplifies a video signal among signals received by a tuner 804, a video signal processing circuit 806 that converts the signal outputted from the video wave amplifier circuit 805 into a color signal corresponding to each color of red, green, and blue, and a control circuit 807 that converts the video signal to input specification of the driver IC. In the case of digital driving, a signal dividing circuit 808 may be provided at a signal line side to divide an input digital signal into m numbers of pieces to be supplied.

Among signals received by the tuner 804, a voice signal is transmitted to a voice wave amplifier circuit 809 and the output is supplied to a speaker 813 via a voice signal processing circuit 810. A control circuit 811 receives information on controlling a receiving station (received frequency) or volume to send a signal to the tuner 804 and the voice signal processing circuit 810.

Figure 10F:
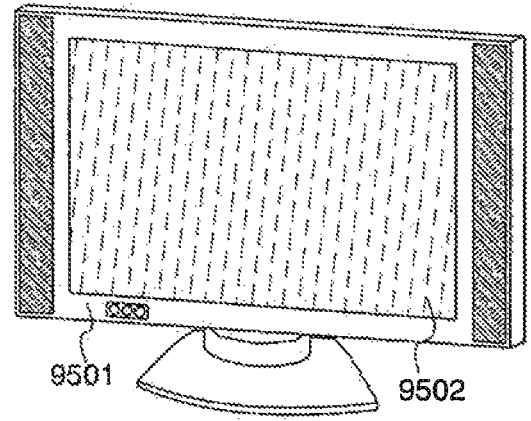

A television set as illustrated in FIG. 10F can be completed by installing such the external circuit and the EL display panel into a housing. Needless to say, the present invention is not limited to the television set but can be applied to various usages especially as a large display medium such as a monitor of a personal computer, an information board in the station or the airport, or an advertisement board in the street. This example can be freely combined with the foregoing embodiment or another example.

EXAMPLE 9

A display device according to the present invention can be used as an ID card capable of sending and receiving data out of touch by installing a functional circuit such as a memory or a processing circuit or an antenna coil to the display device. An example of the structure of such an ID card is explained with reference to drawings.

Figure 12A:
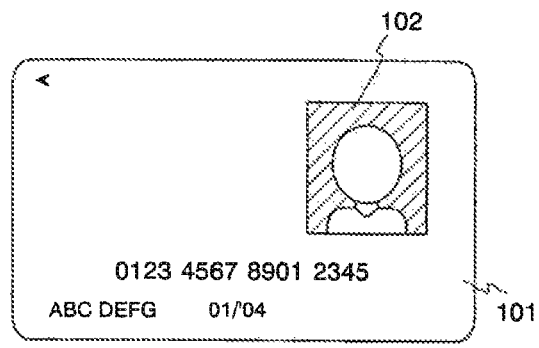
FIGS. 12A and 12B are explanatory views of an ID card using a display device according to the present invention.

FIG. 12A illustrates one embodiment of an ID card installed with a display device according to the present invention. The ID card illustrated in FIG. 12A is a non-contact type ID card that sends and receives data to/from a reader/writer of a terminal device. Reference numeral 101 denotes a card main body, and reference numeral 102 denotes a pixel portion of a display device installed to the card main body 101.

Figure 12B:
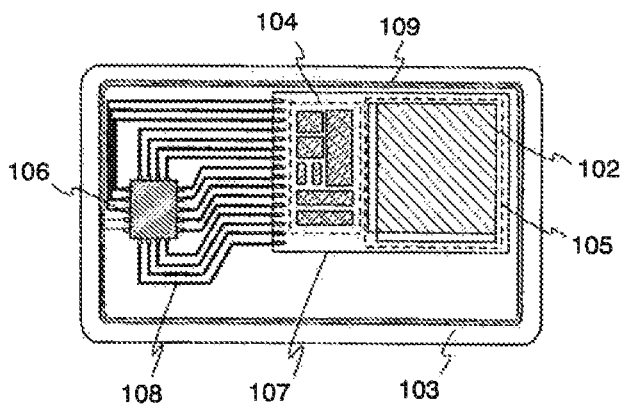

FIG. 12B illustrates the structure of a card substrate 103 included in the card main body 101 illustrated in FIG. 12A. An ID chip 104 formed by a thin semiconductor film and a display device 105 according to the foregoing embodiment or example are pasted onto the card substrate 103. Both of the ID chip 104 and the display device 105 are formed over a substrate prepared separately and transferred over the card substrate 103. As a method of transferring, a thin film integrated circuit is manufactured by a multiple of TFTs, and the thin film integrated circuit is pasted with a small vacuum tweezers, or selectively pasted by using a UV light irradiation method. A pixel portion or a driver circuit unit in the display device can be transferred in accordance with the foregoing method. A portion that is formed by using a thin film semiconductor film including the ID chip 104 and the display device 105 to be transferred is referred to as a thin film portion 107.

An integrated circuit 106 manufactured by using a TFT is mounted to the card substrate 103. A method of mounting the integrated circuit 106 is not especially restricted. A known COG method, a wire bonding method, a TAB method, and the like can be used. The integrated circuit 106 is electrically connected to the thin film portion 107 via a wiring 108 that is provided to the card substrate 103.

An antenna coil 109 electrically connected to the integrated circuit 106 is formed over the card substrate 103. Since data can be sent and received by the antenna coil 109 by utilizing electromagnetic induction, a non-contact type ID card is less subject to damage due to physical abrasion than a contact type ID card. The non-contact type ID card can be used as a tag (wireless tag) that controls information out of touch. The non-contact type ID card can control so much larger amount of information than that of a bar code that can also read information out of touch. The distance between the object and the terminal device that can read information can be made longer than that between the object and the bar code.

FIG. 12B illustrates an example of forming the antenna coil 109 over the card substrate 103; however, an antenna coil manufactured separately can be mounted to the card substrate 103. For example, a copper wire or the like is winded into a coil form to be pressed between two plastic films having thicknesses of approximately 100 μm can be used as an antenna coil. Alternatively, an antenna coil can be formed into the thin film integrated circuit. The single antenna coil 109 is used in the single ID card in FIG. 12B; however, a plurality of the antenna coils 109 can be used.

FIGS. 12A and 12B illustrate a mode of the ID card mounted with the display device 105; however, the present invention is not limited thereto, the display device is not always required to be provided. In the case of providing the display device, the data of a photograph of the face can be displayed on the display device, which can yield difficulty in substitution of the photograph of the face compared to a printing method. The display device can display information except the photograph of the face, which can improve the function of the ID card.

As the card substrate 103, a plastic substrate having flexibility can be used. As the plastic substrate, ARTON made from norbornene resin having a polar group manufactured by JSR Corporation can be used. Further, a plastic substrate such as polyethylene terephthalate (PET), polyether sulfone (PES), polyethylenenaphthalate (PEN), polycarbonate (PC), nylon, polyetheretherketone (PEEK), polysulfone (PSF), polyetherimide (PEI), polyarylate (PAR), polybutylene terephthalate (PBT), or polyimide can be used.

In this example, the electrical connection of an ID chip and a thin film integrated circuit is not limited to a mode illustrated in FIGS. 12A and 12B. For example, a terminal of the ID chip can be directly connected to a terminal of the thin film integrated circuit by anisotropic conductive resin or solder.

In FIG. 12, the thin film integrated circuit and the wiring provided to the card substrate can be connected with each other by a wire bonding method, a flip chip method using a solder ball, or connected directly with each other by using anisotropic conductive resin or solder. This example can be freely combined to the foregoing embodiment or another example. Further, the display device according to the present invention can be used by being built into a semiconductor device such as an ID tag, a wireless chip, or a wireless tag.

EXAMPLE 10

A light-emitting element according to the present invention as described above can be applied to a pixel portion of a light-emitting device having a display function or a lightening portion of a light-emitting device having a lightening function. In this example, a circuit structure and a driving method of the light-emitting device having a display function is explained with reference to FIGS. 13 to 16.

Figure 13:
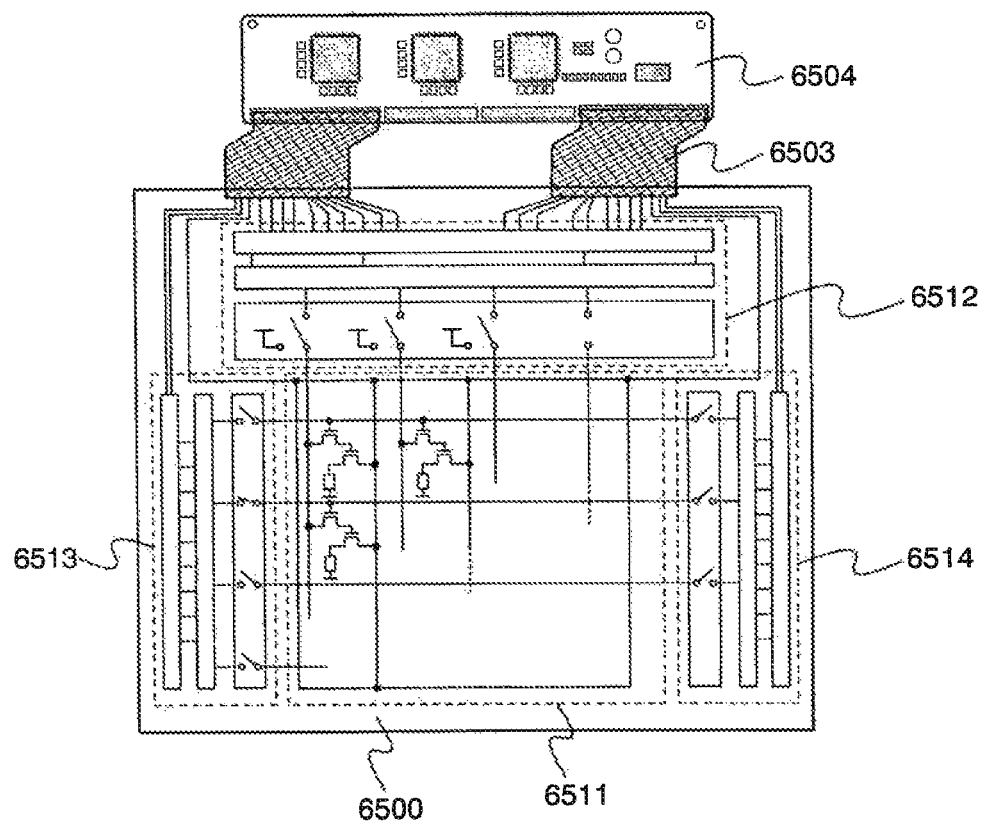
FIG. 13 is a top view of a light-emitting device according to the present invention.

FIG. 13 is a schematic view of a top face of a light-emitting device applied with the present invention. A pixel portion 6511, a source signal line driver circuit 6512, a writing gate signal line driver circuit 6513, and an erasing gate signal line driver circuit 6514 are provided over a substrate 6500. Each of the source signal line driver circuit 6512, the writing gate signal line driver circuit 6513, and the erasing gate signal line driver circuit 6514 is connected to an FPC (flexible printed circuit) 6503 that is an external input terminal via a wiring group. Each of the source signal line driver circuit 6512, the writing gate signal line driver circuit 6513, and the erasing gate signal line driver circuit 6514 receives a video signal, a clock signal, a start signal, a reset signal, and the like from the FPC 6503. A printed wiring board (PWB) 6504 is fixed to the FPC 6503. The driver circuit portion is not always required to be provided over a substrate so as to share the substrate with the pixel portion 6511. For example, the driver circuit portion may be formed at the outside of the substrate by using TCP or the like that is formed by mounting an IC chip over an FPC provided with a wiring pattern.

In the pixel portion 6511, a plurality of source signal line extended in columns is arranged in rows. A current supply line is arranged in rows. In the pixel portion 6511, a plurality of gate signal lines extended in rows is arranged in columns. In the pixel portion 6511, a plurality of pairs of circuits including a light-emitting element is arranged.

Figure 14:
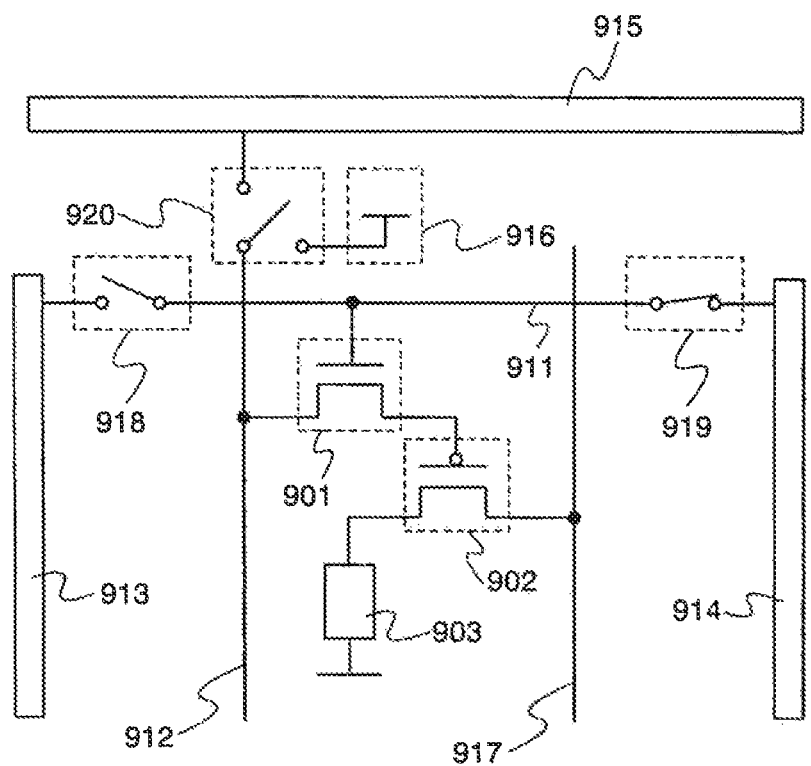
FIG. 14 is a view of showing a circuit for operating one pixel In a light-emitting device according to the present invention.

FIG. 14 is a diagram for showing a circuit for operating one pixel. The circuit illustrated in FIG. 14 comprises a first transistor 901, a second transistor 902, and a light-emitting element 903. Each of the first transistor 901 and the second transistor 902 is a three-terminal element including a gate electrode, a drain region, and a source region, in which a channel region is formed between the drain region and the source region. Since the source region and the drain region are varied depending on the structure of a transistor, an operational condition, and the like, it is difficult to distinguish the source region from the drain region. In this example, regions serving as a source or a drain are referred to as a first electrode and a second electrode, respectively.

A gate signal line 911 and a writing gate signal line driver circuit 913 are provided so as to be electrically connected or non-connected with each other by a switch 918. The gate signal line 911 and an erasing gate signal line driver circuit 914 are provided so as to be electrically connected or non-connected with each other by a switch 919. A source signal line 912 is provided so as to electrically connect to either a source signal line driver circuit 915 or a power source 916 by a switch 920. The gate of the first transistor 901 is electrically connected to the gate signal line 911. The first electrode of the first transistor 901 is electrically connected to the source signal line 912, and the second electrode of the first transistor 901 is electrically connected to the gate electrode of the second transistor 902. The first electrode of the second transistor 902 is electrically connected to the current supply line 917 and the second electrode of the second transistor 902 is electrically connected to one electrode included in the light-emitting element 903. The switch 918 may be included in the writing gate signal line driver circuit 913. The switch 919 may be included in the erasing gate signal line driver circuit 914. The switch 920 may be included in the source signal line driver circuit 915.

Figure 15:
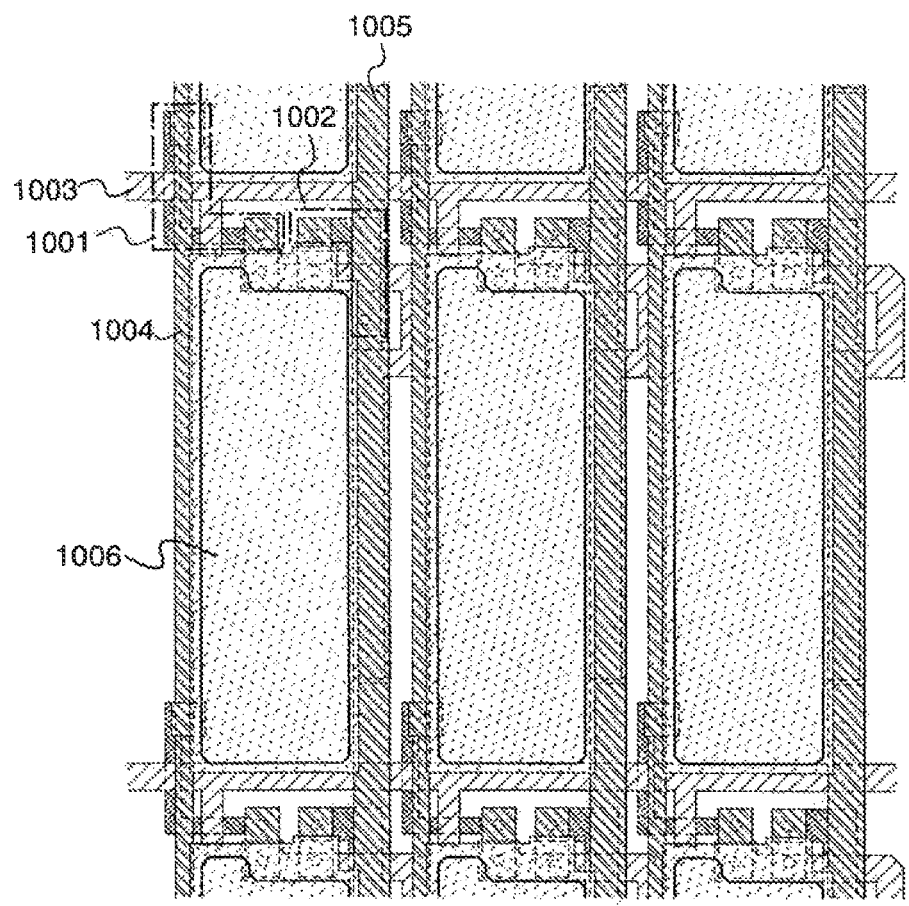
FIG. 15 is a top view of a pixel region in a light-emitting device according to the present invention.

The arrangement of a transistor, a light-emitting element, and the like in a pixel portion is not especially restricted. For example, the foregoing components can be arranged as shown in a top view of FIG. 15. In FIG. 15, the first electrode of a first transistor 1001 is connected to a source signal line 1004, and the second electrode of the first transistor 1001 is connected to the gate electrode of the second transistor 1002. A first electrode of the second transistor is connected to a current supply line 1005, and a second electrode of the second transistor is connected to an electrode 1006 of a light-emitting element. A part of a gate signal line 1003 serves as a gate electrode of the first transistor 1001.

Figure 16:
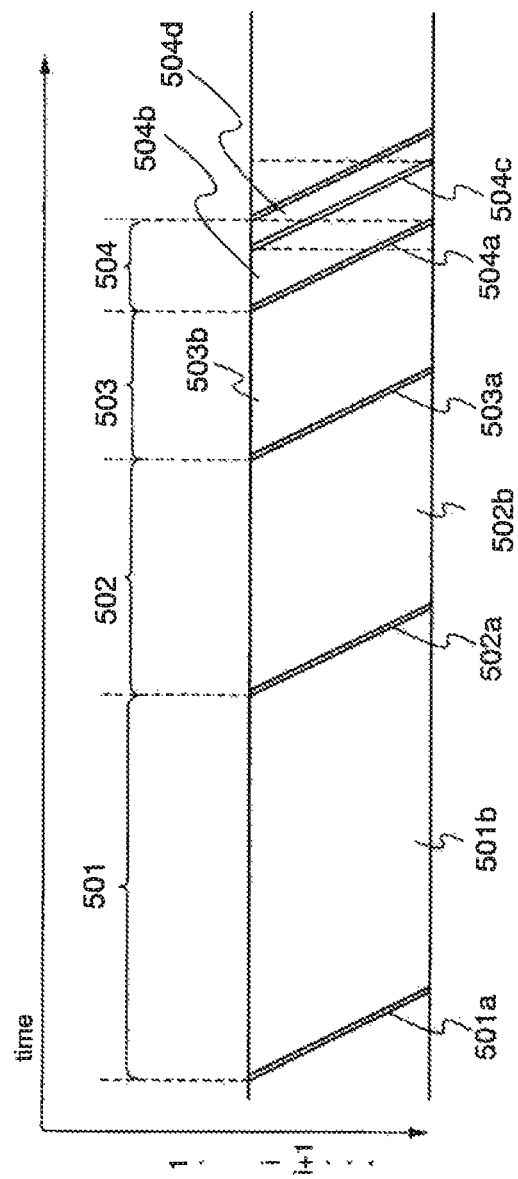
FIG. 16 is an explanatory view of an operation of a frame with time.

A method of driving is explained. FIG. 16 is an explanatory view of an operation of a frame with time. In FIG. 16, a crosswise direction represents passage of time, whereas a lengthwise direction represents the number of scanning stages of a gate signal line.

When an image is displayed by using a light-emitting device according to the present invention, an operation of rewriting and an operation of displaying are repeatedly carried out in a display period. The number of rewriting is not especially restricted; however, the number of rewriting is preferably approximately 60 times for 1 second so that a person who watches the image does not find flickering. The period in which the operations of rewriting and displaying of one image (one frame) are carried out is referred to as one frame period.

One frame is time-divided into four sub frames 501, 502, 503, and 504 including write periods 501a, 502a, 503a, and 504a, and retention periods 501b, 502b, 503b, and 504b. A light-emitting element that is given signals for emitting light is in an emitting state in the retention period. A ratio of a length of the retention period in each sub frame between a first sub frame 501, a second sub frame 502, a third sub frame 503, and a fourth sub frame 504 is the following: $2^3:2^2:2^1:2^0=8:4:2:1$. Accordingly, a 4-bit gray scale can be offered. The number of bits or scales is not limited thereto. For instance, an 8-bit gray scale can be offered by providing eight sub frames.

An operation in one frame is explained. Firstly, a writing operation is carried out from the first line to the last line sequentially in the sub frame 501. Therefore, the starting time of a write period is different depending on lines. Lines move to the retention period 501b in the order of finishing the write period 501a. In the retention period, a light-emitting element that is given signals for emitting light is in an emitting state. Lines move to the next sub frame 502 in the order of finishing the retention period 501b, and a writing operation is carried out from the first line to the last line sequentially as is the case with the sub frame 501. Operations as noted above are repeatedly carried out to finish at last the retention period 504b of the sub frame 504. When an operation in the sub frame 504 is finished, an operation in the next frame is started. The integration of the time of emitting light in each of the sub frames is an emitting time of each light-emitting element in one frame. By varying the emitting time for each light-emitting element to be variously combined in one pixel, various displaying color can be formed having different luminance and chromaticity.

In the case that write is finished before finishing the write of a last line and a retention period in the line moved to a retention period is intended to be forced into termination as is the case with the sub frame 504, an erase period 504c is provided after the retention period 504b to control so that a line is forced into a non-emission state. The line forced into a non-emission state holds the state over a fixed period of time (the period is referred to as a non-emission period 504b). Upon finishing the write period of the last line, lines move to the next write period (or a frame) from the first line. As illustrated in FIG. 18, one horizontal period is divided into two, either of which is used to write and the other of which is used to erase, to write is carried out in a pixel of a certain line and an input of an erasing signal for making a pixel be a non-emission state is carried out in a pixel of a certain line. In the divided horizontal period, each gate signal line 911 is selected to input a corresponding signal to a source signal line 912. For instance, the former horizontal period selects the i line, and the later horizontal period selects the j line in a certain horizontal period. Hence, it is possible to operate as if two lines are selected simultaneously. That is, a video signal is written into a pixel in write periods 501a to 504a by using a write period of each of one horizontal period, in which case a pixel is not selected in an erase period in one horizontal period. A signal written into a pixel in the erase period 504c is erased by using an erase period in another horizontal period, in which case a pixel is not selected in a write period in one horizontal period. Therefore, a display device having a pixel with a high opening ratio can be provided and manufacturing yields can be improved.

In this example, the sub frames 501 to 504 are arranged in the order of descending retention period; however, the present invention is not limited thereto. For instance, the sub frames 501 to 504 are, for example, arranged in the order of ascending retention period. The sub frame may be further divided into a plurality of frames. That is, scanning of the gate signal line can be carried out at a plurality of times during the period of giving the same video signal.

An operation of a circuit illustrated in FIG. 14 is explained in a write period and an erase period. First, an operation in a write period is explained. In the write period, the gate signal line 911 at the i line (i is a natural number) is electrically connected to the write gate signal line driver circuit 913. The signal line 911 is not connected to the erase gate signal line driver circuit 914. The source signal line 912 is electrically connected to the source signal line driver circuit 915 via the switch 920. A signal is inputted to a gate if the first transistor 901 connected to the gate signal line 911 at the i line, and the first transistor 901 is turned ON. At this time, a video signal is simultaneously inputted to the source signal line at the first row to the last row. Video signals inputted from the source signal line 912 at each row are independent to each other. Video signals inputted from the source signal line 912 are inputted to a gate electrode of the second transistor 902 via the first transistor 901 connected to each source signal line. Signals inputted to a gate electrode of the second transistor 902 controls ON/OFF of the second transistor 902. When the second transistor 902 is turned ON, voltage is applied to the light-emitting element 903 and current passes through in the light-emitting element 903. Emission or Non-emission of the light-emitting element 903 is depending on a signal inputted to a gate electrode of the second transistor 902. In the case that the second transistor 902 is a P-channel type, a light-emitting element 903 emits light by being a Low Level signal inputted to a gate electrode. On the other hand, in the case that the second transistor 902 is an N-channel type, a light-emitting element 903 emits light by being a High Level signal is inputted to a gate electrode of the second transistor 902.

Then, an operation in an erase period is explained. In the erase period, the gate signal line 911 (j is a natural number) is electrically connected to an erase gate signal line driver circuit 914 via the switch 919. The gate signal line 911 is not connected to the write gate signal line driver circuit 913. The source signal line 912 is electrically connected to the power source 916 via the switch 920. A signal is inputted to a gate of the first transistor 901 connected to the gate signal line 922 at the j line, and the first transistor 901 is turned ON. At this time, an erase signal is simultaneously inputted to the source signal line at the first row to the last row. The erase signal inputted from the source signal line 912 is inputted to a gate electrode of the second transistor 902 via the first transistor 901 connected to each source signal line. By the erase signal inputted to the gate electrode of the source signal line 912, the second transistor 903 is turned OFF and current supply from the current supply line 917 to the light-emitting element 903 is stopped. The light-emitting element 903 is forced into non emission state. In the case that the second transistor 902 is a P-channel type, a light-emitting element 903 does not emit light by being a High Level signal inputted to a gate electrode. On the other hand, in the case that the second transistor 902 is an N-channel type, a light-emitting element 903 does not emit light by being a Low Level signal is inputted to a gate electrode of the second transistor 902.

In the erase period, a signal for erasing is inputted by an operation as described above at the j line. However, there is the case that the j line is an erase period and another line (the i line in this instance) is a write period. In this instance, it is required that a signal for erasing is inputted to the j line and a signal for writing is inputted to the i line by utilizing a source signal line at the same row. Accordingly, an operation explained as follows is preferably carried out.

Immediately after the light-emitting element 903 at the j−1 line is into a non emission state by an operation in the erase state, the gate signal line 911 and the erase gate signal line driver circuit 914 are made into non-emission states, and the source signal line 912 is connected to the source signal line driver circuit 915 by changing the switch 920. As well as connecting the source signal line 912 to the source signal line driver circuit 915, the gate signal line 911 is connected to the write gate signal line driver circuit 913 by changing the switch 918. A signal is selectively inputted to the gate signal line 911 at the i line from the write gate signal line driver circuit 913, and the first transistor 901 is turned ON, simultaneously, a video signal for writing is inputted to the source signal line 912 at the first row to the last row from the source signal line driver circuit 915. By the video signal, the light-emitting element 903 becomes in an emission state or non-emission state.

Immediately after finishing the write period of the i line as noted above, lines move to an erase period at the j line. Hence, the gate signal line and the write gate signal driver circuit 913 are disconnected by changing the switch 918, simultaneously; a source line and the power source 916 are connected by changing the switch 920. Further, the gate signal line 911 and the write gate signal line driver circuit 913 are disconnected, simultaneously; the gate signal line 911 is connected to the erase gate signal line driver circuit 914 by changing the switch 919. A signal is selectively inputted to the gate signal line at the f line from the erase gate signal line driver circuit 914, and the first transistor 901 is turned ON, then, an erase signal is inputted from the power source 916. By the erase signal, the light-emitting element 903 is forced into non-emission state. Immediately after finishing an erase period at the j line, lines move to an erase period at the i+1 line. Hereinafter, an erase period and a write period may be carried out repeatedly to operate up to an erase period at the last line.

In this example, a mode in which a write period at the i line, but not exclusively, is provided between an erase period at the j−1 line and an erase period at the j line is explained. A write period at the i line can be provided between an erase period and an erase period at the j+1n line.

In this example, the erase gate signal line driver circuit 914 and a certain gate signal line are disconnected, simultaneously; an operation of connecting the write gate signal line driver circuit 913 to another gate signal line is repeatedly carried out. Such the operation can be carried out in a frame that is not provided with a non-emission period. This example can be freely carried out with the foregoing example or another example.

The light-emitting element according to the present invention can increase the thickness of a passivation film without being adversely affected by peeling, cracking, or the like of the passivation film since a stress relieving layer is formed on a top surface or a bottom surface of the passivation film. As a result, an extreme high blocking effect can be obtained. Therefore, a light-emitting element having high reliability and long lifetime can be provided at high manufacturing yields. In the case that the stress relieving layer is formed over a top surface (both surfaces) of the passivation film, the difference in refractive indexes between the stress relieving layer and air can be reduced by forming the low refractive index layer to have a lower refractive index than that of the stress relieving layer. As a result, efficiency of light extraction to the outside can be improved.

The light-emitting element having the above noted operational advantages can be adopted in a display device as typified by an EL display. The display device can be broadly divided into two kinds, that is, a simple matrix system in which an electroluminescent layer is formed between two kinds of stripe-shaped electrodes provided so as to be right angles with each other, and an active matrix system in which an electroluminescent layer is formed between a pixel electrode and an opposite electrode arranged in a matrix configuration and connected to TFT. The light-emitting element according to the present invention can be applied to either of the simple matrix system and the active matrix system. The foregoing display device can be applied to a ubiquitous goods such as various electronic appliances or an ID card, and so the industrial applicability of the present invention is extremely large.

Although the present invention has been fully described by way of examples with reference to the accompanying drawings, it is to be understood that various changes and modifications will be apparent to those skilled in the art. Therefore, unless otherwise such changes and modifications depart from the scope of the present invention hereinafter described, they should be construed as being included therein.

What is claimed is:

1. A light-emitting device comprising:
   a first substrate;
   a transistor over the first substrate;
   an insulating layer over the transistor, the insulating layer comprising silicon and oxygen;
   a color filter over and in contact with the insulating layer;
   a first electrode over the color filter, the first electrode comprising ITO;
   a light-emitting layer over the first electrode;
   a second electrode over the light-emitting layer;
   a first layer over the second electrode, the first layer comprising a first organic material;
   a second layer over the first layer, the first layer comprising silicon and nitrogen;
   a third layer over the second layer, the third layer comprising a second organic material; and
   a second substrate over the third layer, the second substrate comprising a metal,
   wherein the light-emitting layer is configured to emit white light.

2. The light-emitting device according to claim 1, further comprising a fourth layer,
   wherein the fourth layer comprises Li, Ca, or Ba.

3. The light-emitting device according to claim 1, wherein at least one of the first layer and the third layer comprises an organic resin.

4. The light-emitting device according to claim 1, wherein the light-emitting layer comprises a plurality of luminescent center pigments.

5. The light-emitting device according to claim 1, wherein each of the first electrode and the second electrode is capable of transmitting light.

6. The light-emitting device according to claim 1, wherein the color filter is in contact with the first electrode.

7. The light-emitting device according to claim 1, wherein the first substrate is configured to transmit light emitted from the light-emitting layer.

8. The light-emitting device according to claim 1, further comprising a filling layer between the third layer and the second substrate,
wherein the filling layer comprises a material having a refractive index of 1.2 to 1.6.

9. An electronic device comprising the light-emitting device according to claim 1, wherein the electronic device comprises at least one of a tuner, a speaker, a video signal processing circuit, a video wave amplifier circuit, a signal dividing circuit, a voice wave amplifier circuit, and a voice signal processing circuit.

10. A light-emitting device comprising:
a first substrate;
a transistor over the first substrate;
an insulating layer over the transistor, the insulating layer comprising silicon and oxygen;
a color filter over and in contact with the insulating layer;
a first electrode over the color filter, the first electrode comprising ITO;
a light-emitting layer over the first electrode;
a second electrode over the light-emitting layer;
a first layer over and in contact with the second electrode, the first layer comprising a first organic material;
a second layer over the first layer, the first layer comprising silicon and nitrogen;
a third layer over and in contact with the second layer, the third layer comprising a second organic material; and
a second substrate over the third layer, the second substrate comprising a metal,
wherein the first electrode is electrically connected to the transistor through an opening provided in the insulating layer, and
wherein the light-emitting layer is configured to emit white light.

11. The light-emitting device according to claim 10, further comprising a fourth layer,
wherein the fourth layer comprises Li, Ca, or Ba.

12. The light-emitting device according to claim 10, wherein at least one of the first layer and the third layer comprises an organic resin.

13. The light-emitting device according to claim 10, wherein the light-emitting layer comprises a plurality of luminescent center pigments.

14. The light-emitting device according to claim 10, wherein each of the first electrode and the second electrode is capable of transmitting light.

15. The light-emitting device according to claim 10, wherein the color filter is in contact with the first electrode.

16. The light-emitting device according to claim 10, wherein the first substrate is configured to transmit light emitted from the light-emitting layer.

17. The light-emitting device according to claim 10, further comprising a filling layer between the third layer and the second substrate,
wherein the filling layer comprises a material having a refractive index of 1.2 to 1.6.

18. An electronic device comprising the light-emitting device according to claim 10, wherein the electronic device comprises at least one of a tuner, a speaker, a video signal processing circuit, a video wave amplifier circuit, a signal dividing circuit, a voice wave amplifier circuit, and a voice signal processing circuit.

* * * * *